US011257670B2

(12) United States Patent
Peng et al.

(10) Patent No.: US 11,257,670 B2
(45) Date of Patent: Feb. 22, 2022

(54) METHOD OF MANUFACTURING A SEMICONDUCTOR DEVICE, AND ASSOCIATED SEMICONDUCTOR DEVICE AND SYSTEM

(71) Applicant: TAIWAN SEMICONDUCTOR MANUFACTURING COMPANY LTD., Hsinchu (TW)

(72) Inventors: Shih-Wei Peng, Hsinchu (TW); Chia-Tien Wu, Taichung (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 103 days.

(21) Appl. No.: 16/786,418

(22) Filed: Feb. 10, 2020

(65) Prior Publication Data
US 2021/0249262 A1    Aug. 12, 2021

(51) Int. Cl.
*H01L 23/58* (2006.01)
*H01L 21/02* (2006.01)
*H01L 21/033* (2006.01)

(52) U.S. Cl.
CPC .... *H01L 21/02172* (2013.01); *H01L 21/0337* (2013.01); *H01L 23/585* (2013.01)

(58) Field of Classification Search
None
See application file for complete search history.

(56) References Cited

U.S. PATENT DOCUMENTS

| | | | |
|---|---|---|---|
| 10,950,546 B1* | 3/2021 | Doornbos | H01L 21/76897 |
| 2019/0295940 A1* | 9/2019 | Liaw | H01L 23/5222 |
| 2020/0134128 A1* | 4/2020 | Peng | H01L 21/76895 |
| 2021/0233927 A1* | 7/2021 | Oh | H01L 23/5226 |
| 2021/0272904 A1* | 9/2021 | Komuro | H01L 23/535 |

* cited by examiner

*Primary Examiner* — Evren Seven
(74) *Attorney, Agent, or Firm* — WPAT, P.C., Intellectual Property Attorneys; Anthony King

(57) ABSTRACT

A method of manufacturing a semiconductor device, including: providing a substrate including a first cell and a second cell that are arranged in a first direction; forming a plurality of first metal strips extending in the first direction and arranged in a second direction on a first plane; forming a first trench over a boundary between the first cell and the second cell, wherein a bottom surface of the first trench is on a second plane over the first plane; filling the first trench with a non-conductive material, resulting in a separating wall which extends in the first direction; and forming a plurality of second metal strips extending in the second direction on a third plane over the second plane, wherein a first second metal strip and a second second metal strip separated from each other by the separating wall; wherein the second direction is orthogonal to the first direction.

20 Claims, 51 Drawing Sheets

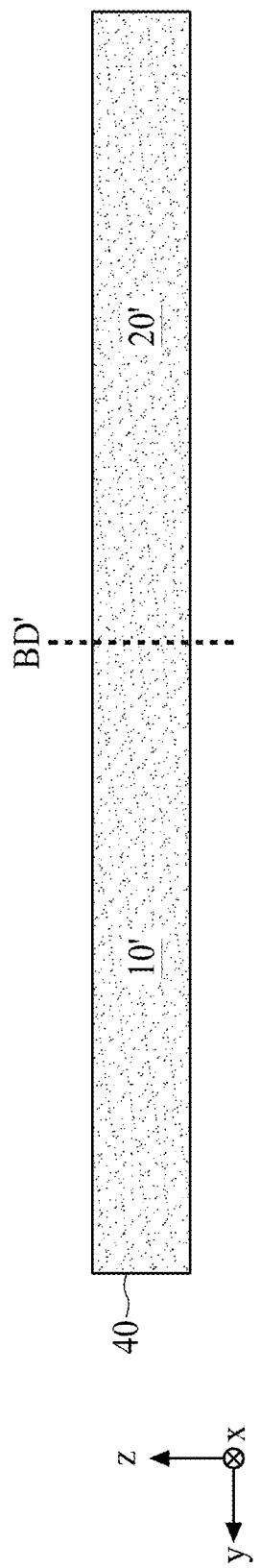

METHOD OF MANUFACTURING A SEMICONDUCTOR DEVICE, AND ASSOCIATED SEMICONDUCTOR DEVICE AND SYSTEM

BACKGROUND

Due to the advanced process of manufacturing semiconductor devices, a size of a semiconductor device is reduced. With a smaller cell height, two adjacent cells might encounter a short-circuited issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
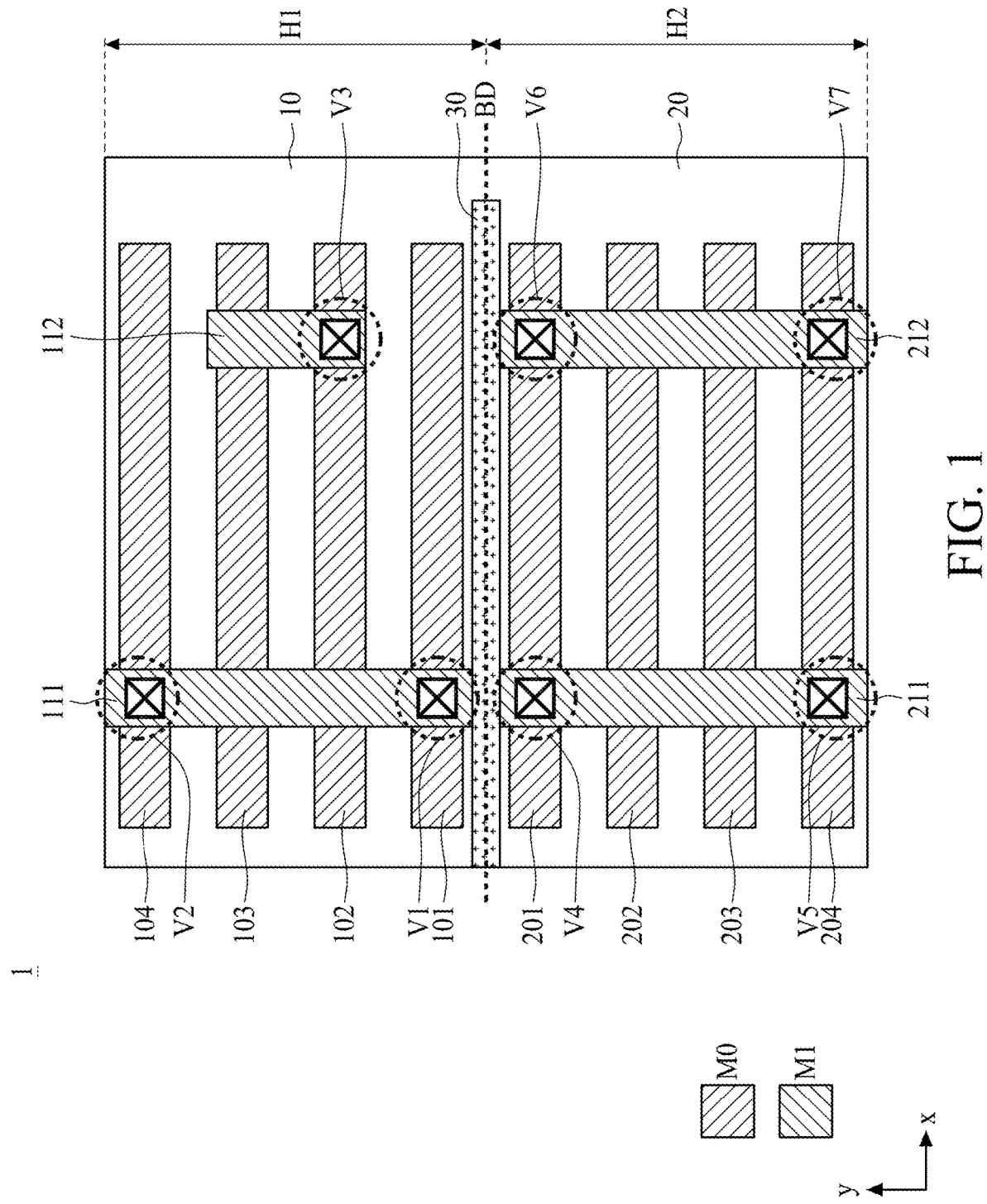
FIG. 1 is a diagram illustrating a semiconductor device in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Due to the advanced process of manufacturing semiconductor devices, a size of a semiconductor device is reduced. For a cell with cell height smaller than 80 nm, the space for metal routing is insufficient. Accordingly, two adjacent cells inevitably encounter a short-circuited issue.

For example, a semiconductor device includes two cells (e.g., a cell A and a cell B) arranged in y direction, where each cell includes transistors to achieve logical functions. The semiconductor device further includes a plurality of metal strips disposed above the cells for signal connection. Specifically, the semiconductor device includes a first M0 metal strip and a second M0 metal strip extending in x direction, wherein the first M0 metal strip is disposed above the cell A, and the second M0 metal strip is disposed above the cell B. The first M0 metal strip and the second M0 metal strip are immediate adjacent to the boundary between the cell A and the cell B. The semiconductor device further includes a first M1 metal strip and a second M1 metal strip extending in y direction, wherein the first M1 metal strip is disposed above the cell A, and the second M1 metal strip is disposed above the cell B. The first M1 metal strip is connected to the first M0 metal strip through a first contact via, and the second M1 metal strip is connect to the second M0 metal strip through a second contact via.

Because the cell height of each cell is reduced, the distance between two adjacent metal strips is reduced, and inevitably, the distance between the metal strip (e.g., the first M0 metal strip) and the boundary is reduced. Accordingly, when the first contact via and the first M1 metal strip are disposed, they might cross the boundary and being short-circuited with the second contact via and the second M1 metal strip. Therefore, the present disclosure proposes a method of manufacturing a semiconductor device, associated semiconductor device and system which can efficiently prevent the metal strips from contacting.

FIG. 1 is a diagram illustrating semiconductor device 1 in accordance with an embodiment of the present disclosure. As shown in FIG. 1, the semiconductor device 1 includes a cell 10 and a cell 20. Each of the cell 10 and the cell 20 includes transistors for achieving logical functions. In the present embodiment, a cell height H1 of the cell 10 ranges from approximately 60 nm to approximately 100 nm, and a cell height H2 of the cell 20 ranges from approximately 60 nm to approximately 100 nm.

The semiconductor device 1 further includes a plurality of metal strips for signal connection. More specifically, the semiconductor device 1 includes a plurality of first metal strips 101, 102, 103 and 104 disposed in a first metal layer (i.e., M0 layer). The plurality of first metal strips 101, 102, 103 and 104 extending in a first direction (i.e., x direction) are arranged in a second direction (i.e., y direction) above the cell 10. The semiconductor device 1 further includes a plurality of first metal strips 201, 202, 203 and 204 disposed in the first metal layer. The plurality of first metal strips 201, 202, 203 and 204 extending in x direction are arranged in y direction above the cell 20.

Moreover, the semiconductor device 1 includes a plurality of second metal strips 111 and 112 disposed in a second metal layer (i.e., M1 layer), wherein the plurality of second metal strips 111 and 112 extends in y direction. The second metal strip 111 is connected to the first metal strips 101 and 104 via contact vias V1 and V2, respectively. The second metal strip 112 is connected to the metal strip 102 via a contact via V3.

The semiconductor device 1 further includes a plurality of second metal strips 211 and 212 disposed in the second metal layer, wherein the plurality of second metal strips 211 and 212 extends in y direction. The second metal strip 211 is connected to the first metal strips 201 and 204 via contact vias V4 and V5, respectively. The second metal strip 212 is connected to the first metal strips 201 and 204 via contact vias V6 and V7.

The semiconductor device 1 further includes a separating wall 30 formed on a boundary BD between the cell 10 and the cell 20. As shown in FIG. 1, the second metal strip 111 above the cell 10 and the second metal strip 211 above the cell 20 are separated from each other by the separating wall 30. With such configuration, when the second metal strip 111 connected to the first metal strip 101, which is immediate adjacent to the boundary BD, is disposed, the separating wall efficiently prevents the contact via V1 and the second metal strip 111 from crossing the boundary BD and being short-circuited with the second metal strip 211.

It should be noted that the semiconductor device 1, in other embodiments, can include a plurality of cells (more than two). Moreover, the number and the routings of the metal strips in each cell shown in FIG. 1 are only for illustrative purpose. Those skilled in the art should readily understand that the cell 10 and the cell 20 can include more metal strips, and the routings of the metal strips in each cell depends on the actual design, which should not be limited by the present disclosure.

Figure 2B:
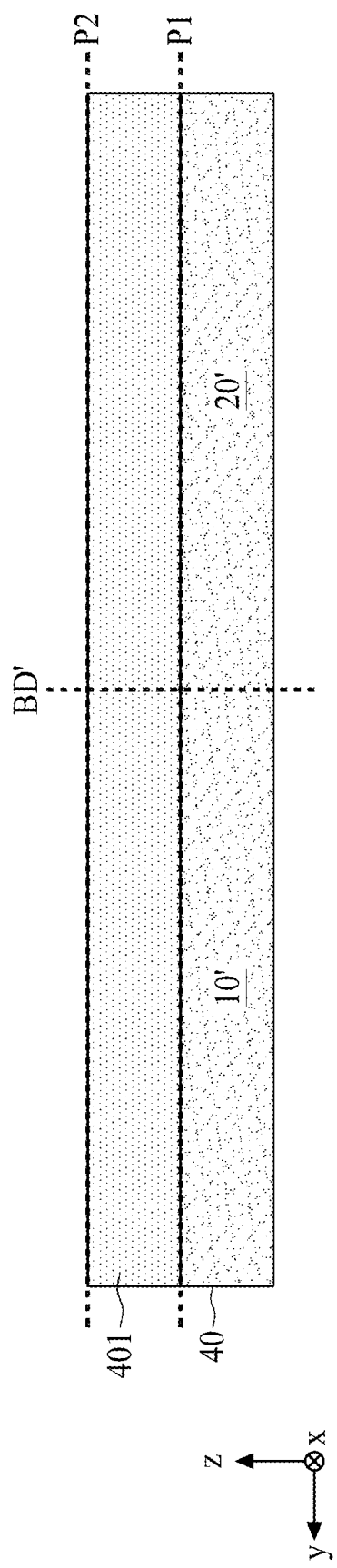
FIG. 2A to FIG. 2T are diagrams illustrating a first part of a process of manufacturing a semiconductor device in accordance with an embodiment of the present disclosure.
Figure 2C:
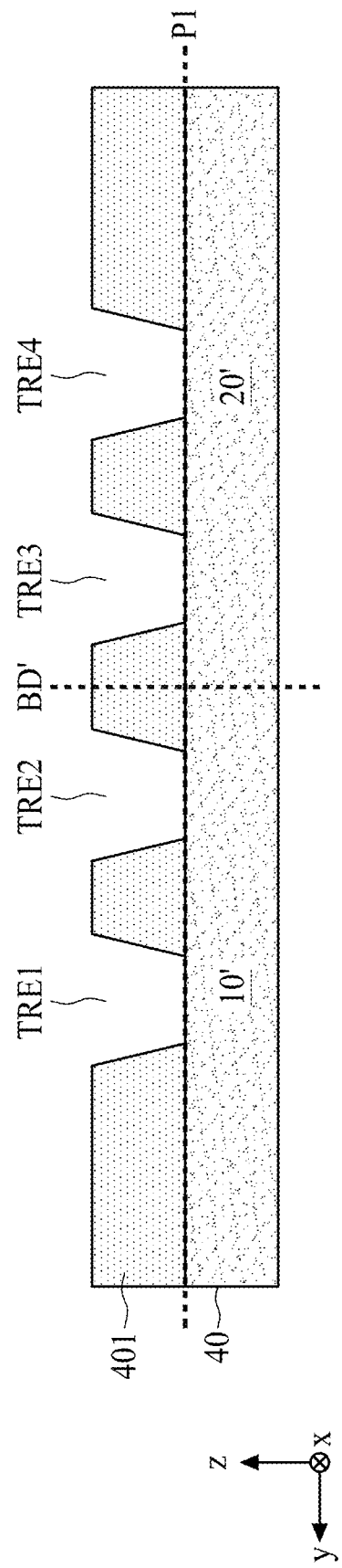
Figure 2D:
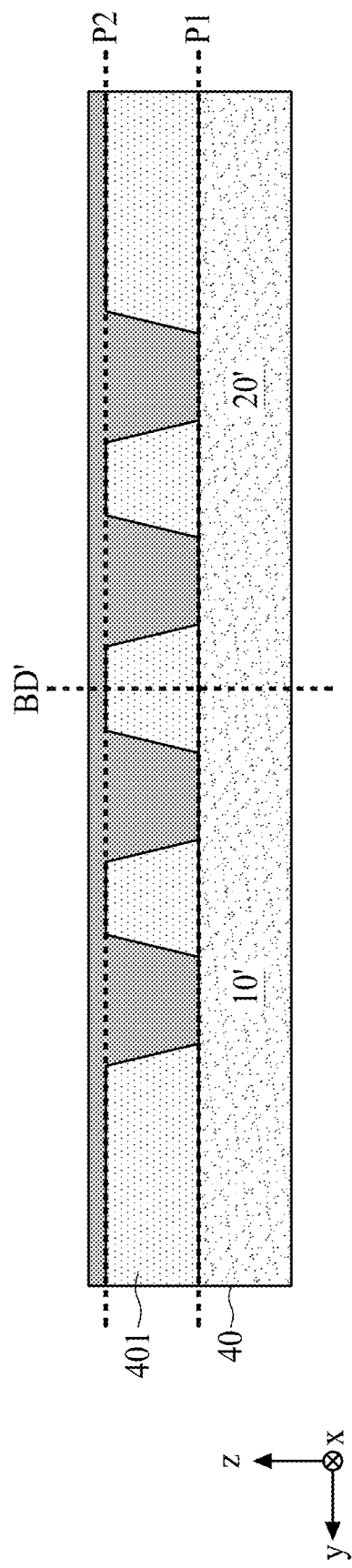
Figure 2E:
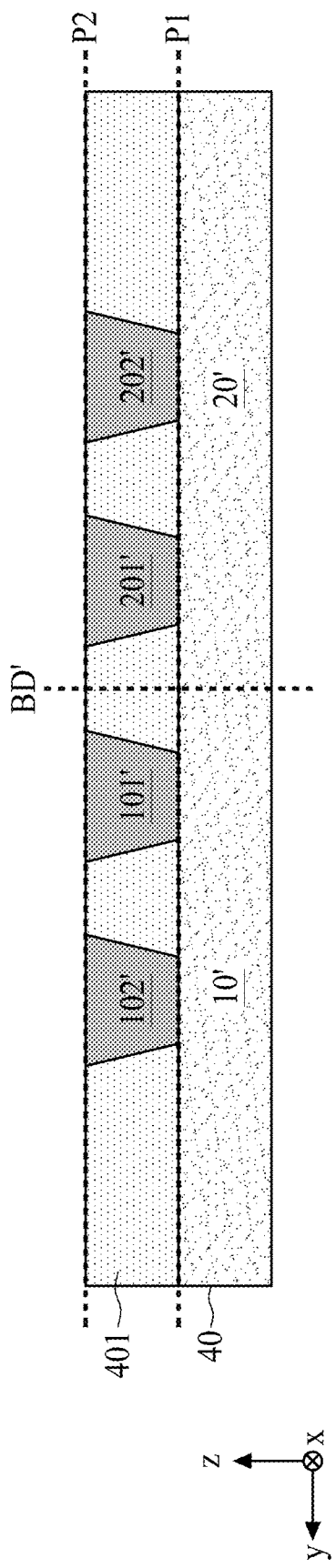
Figure 2F:
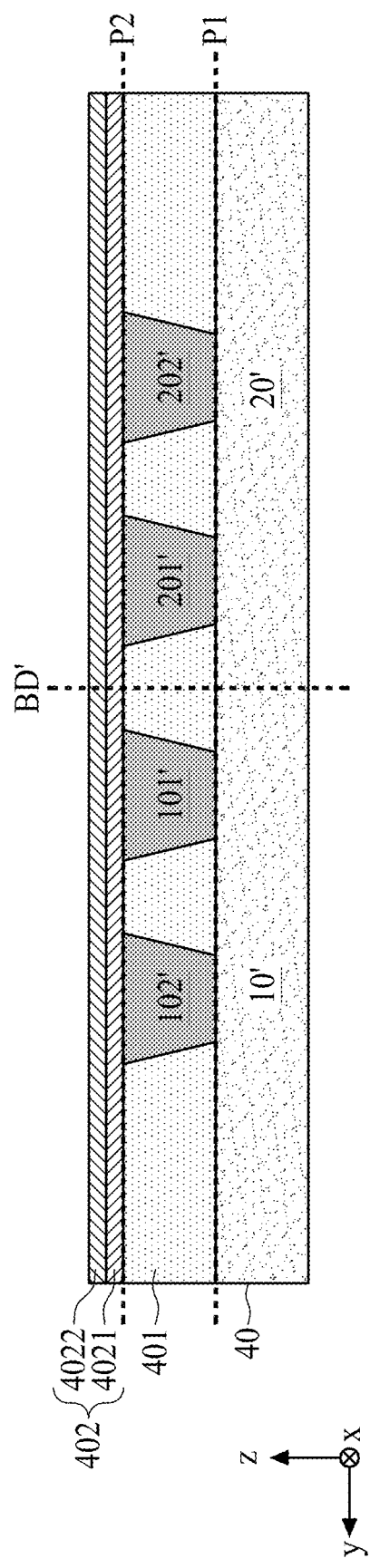
Figure 2G:
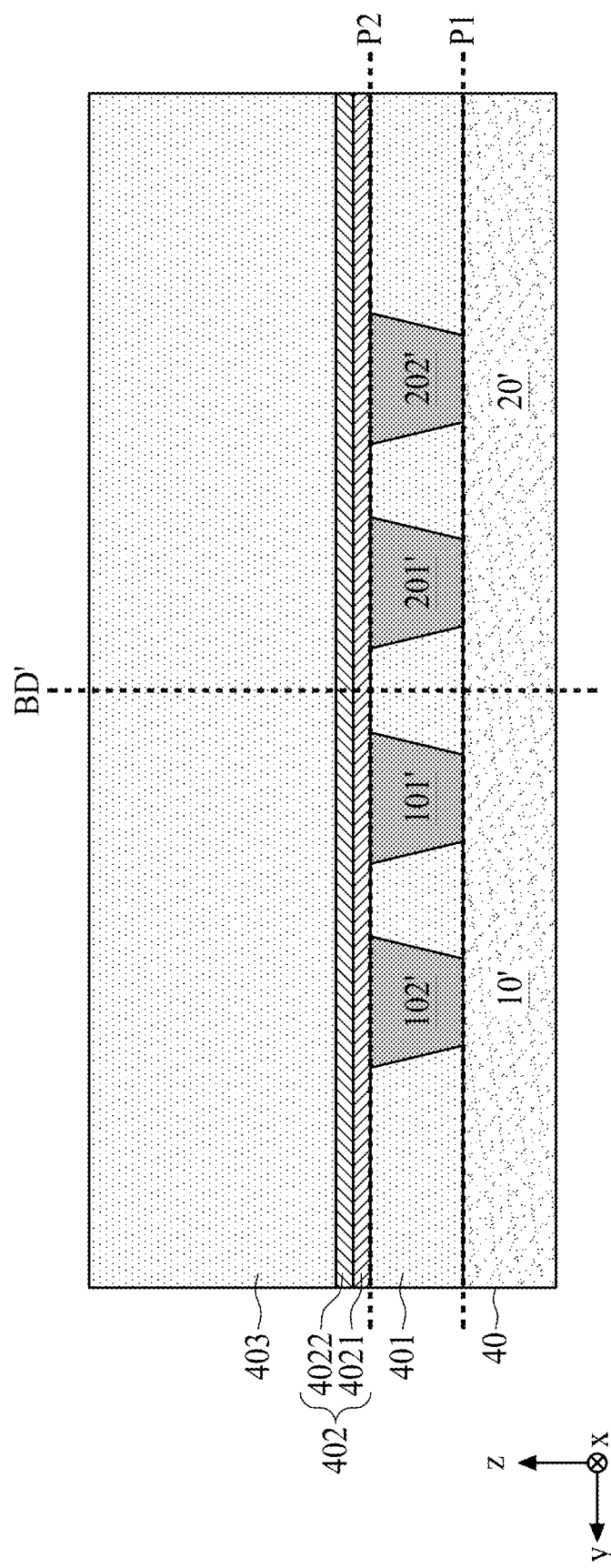
Figure 2H:
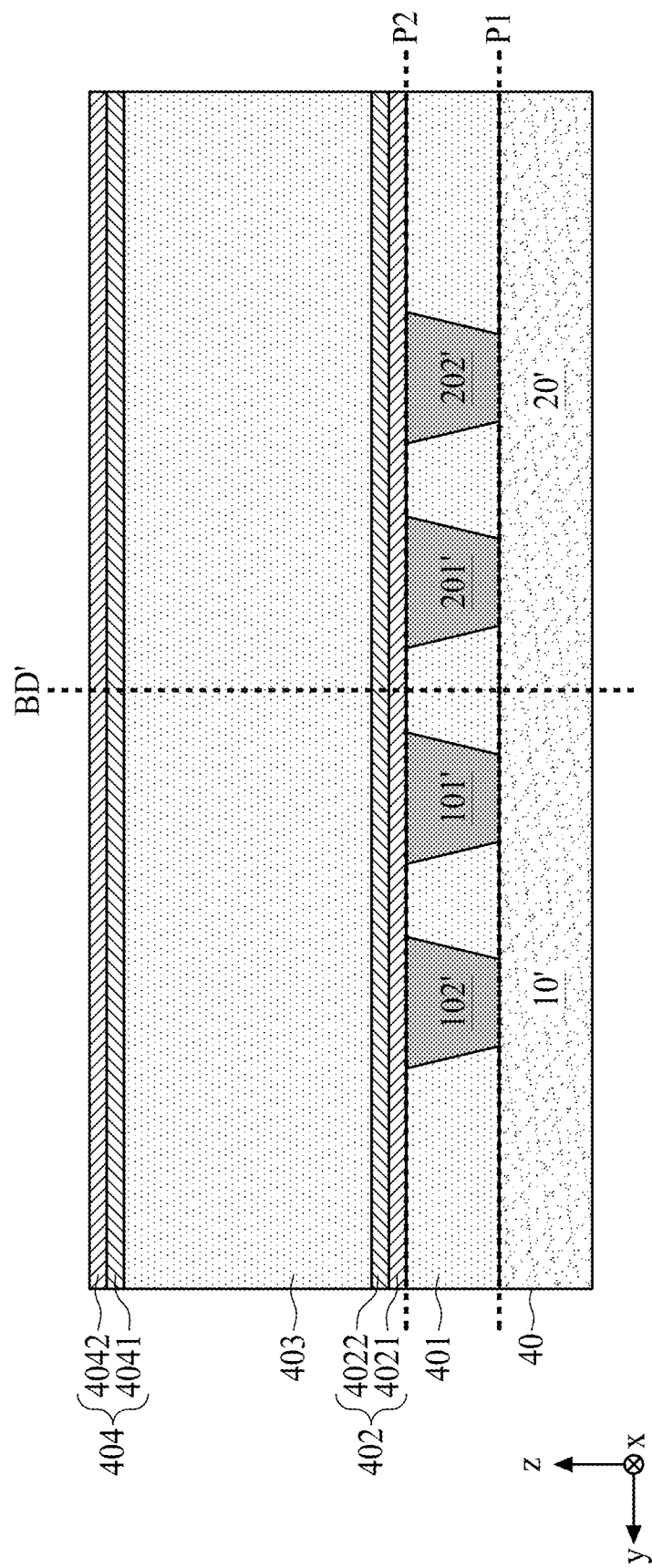
Figure 2I:
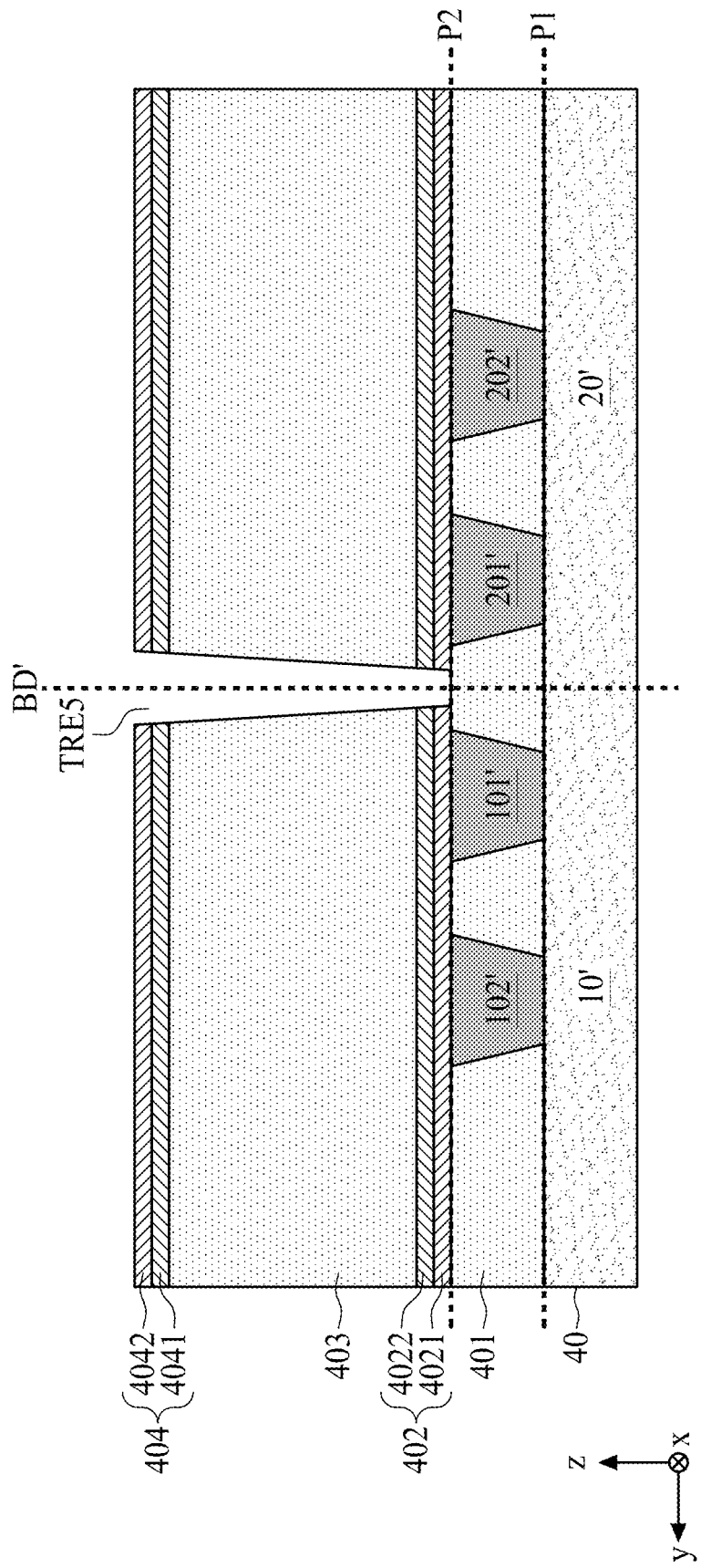
Figure 2J:
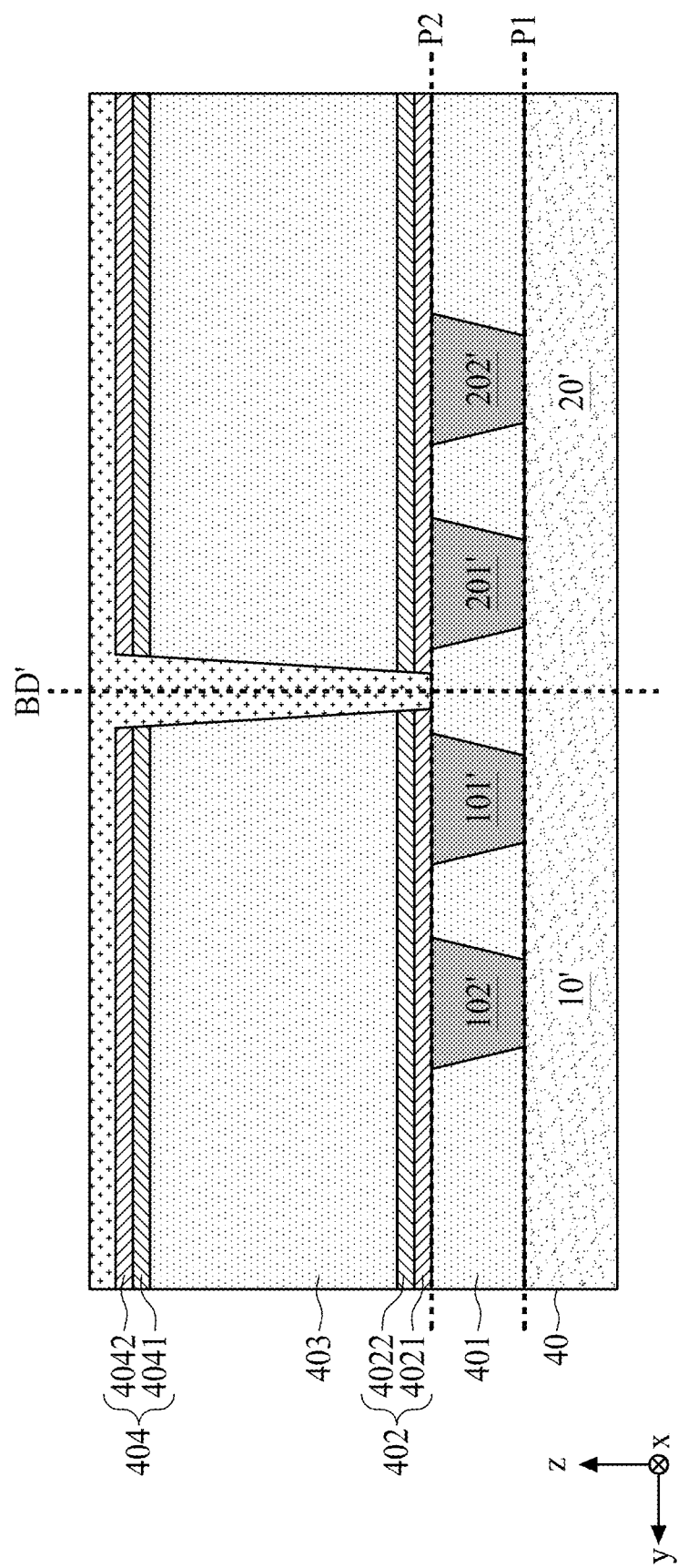
Figure 2K:
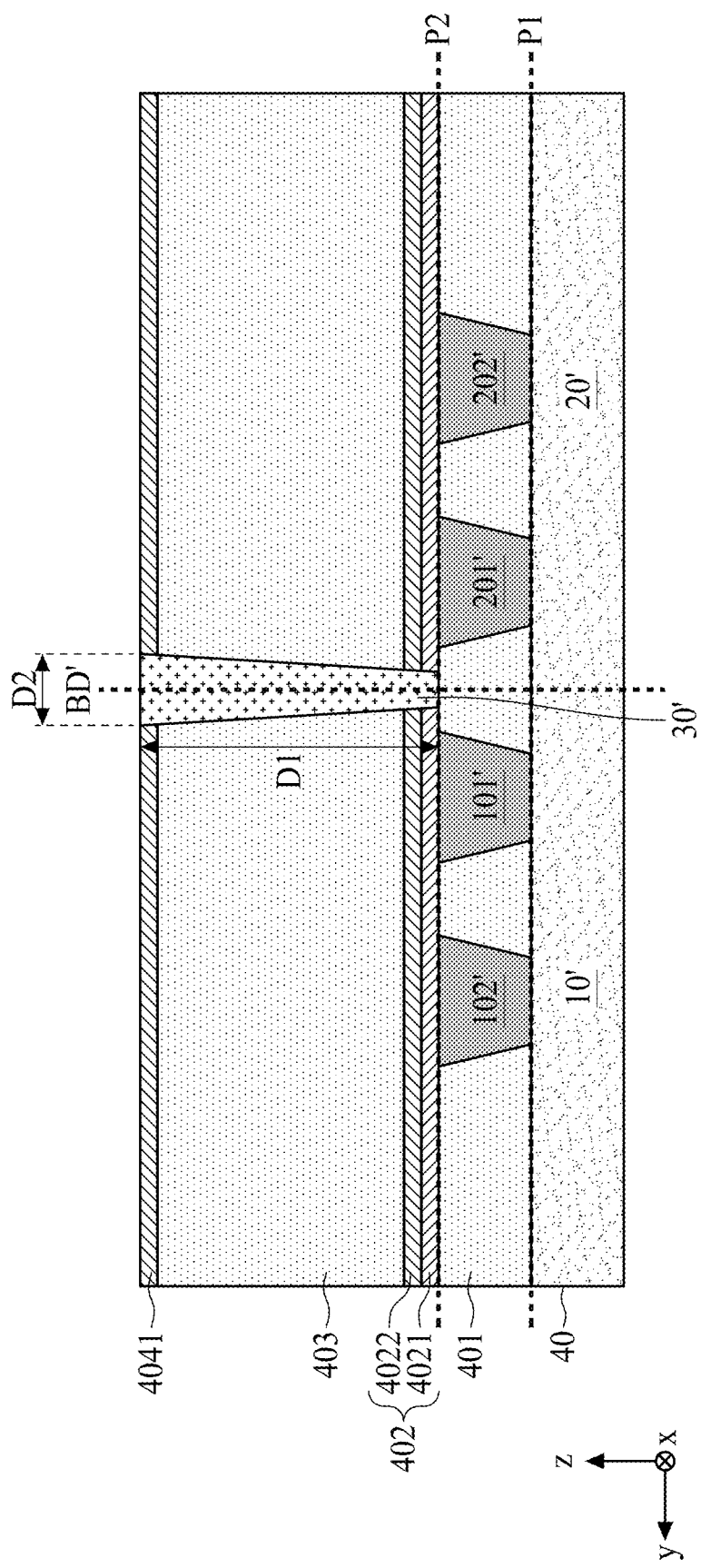
Figure 2L:
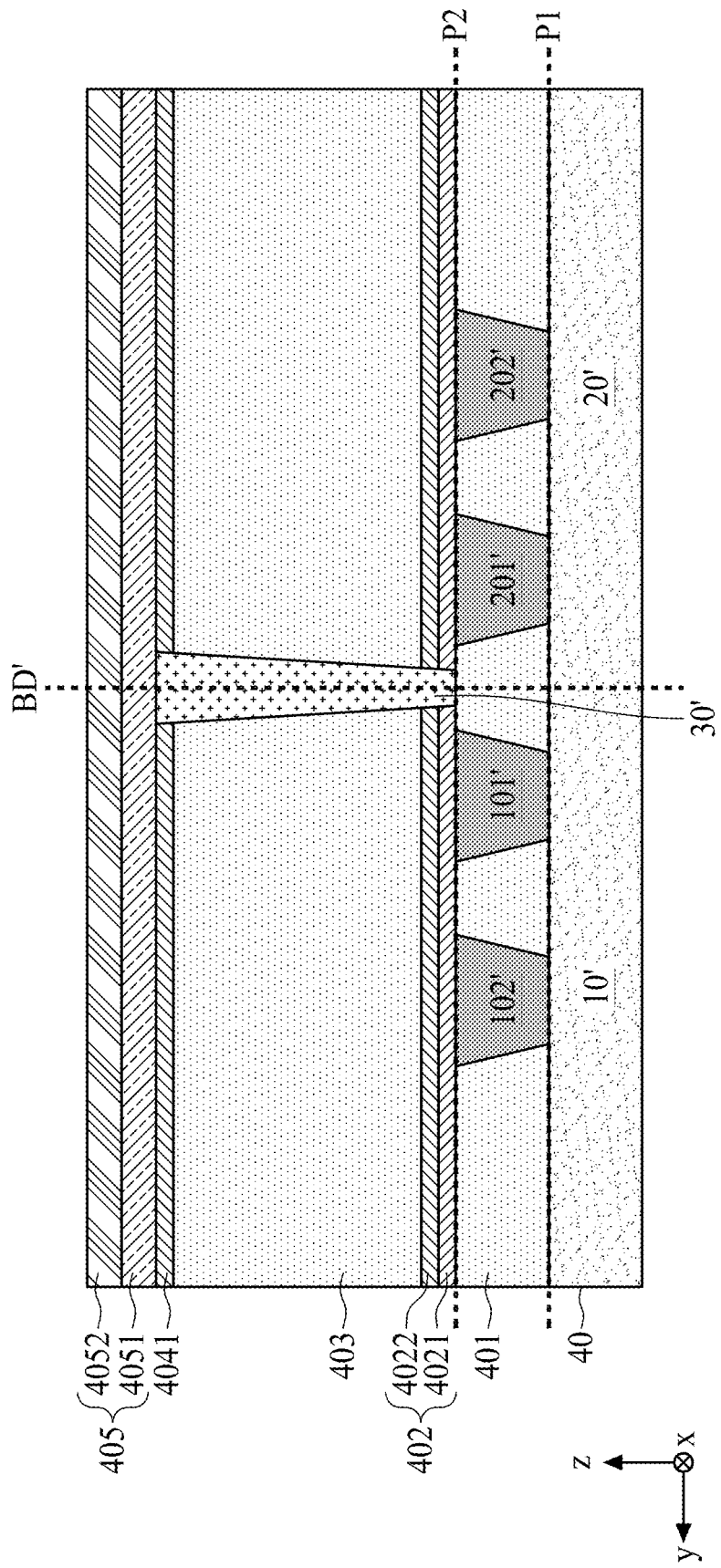
Figure 2M:
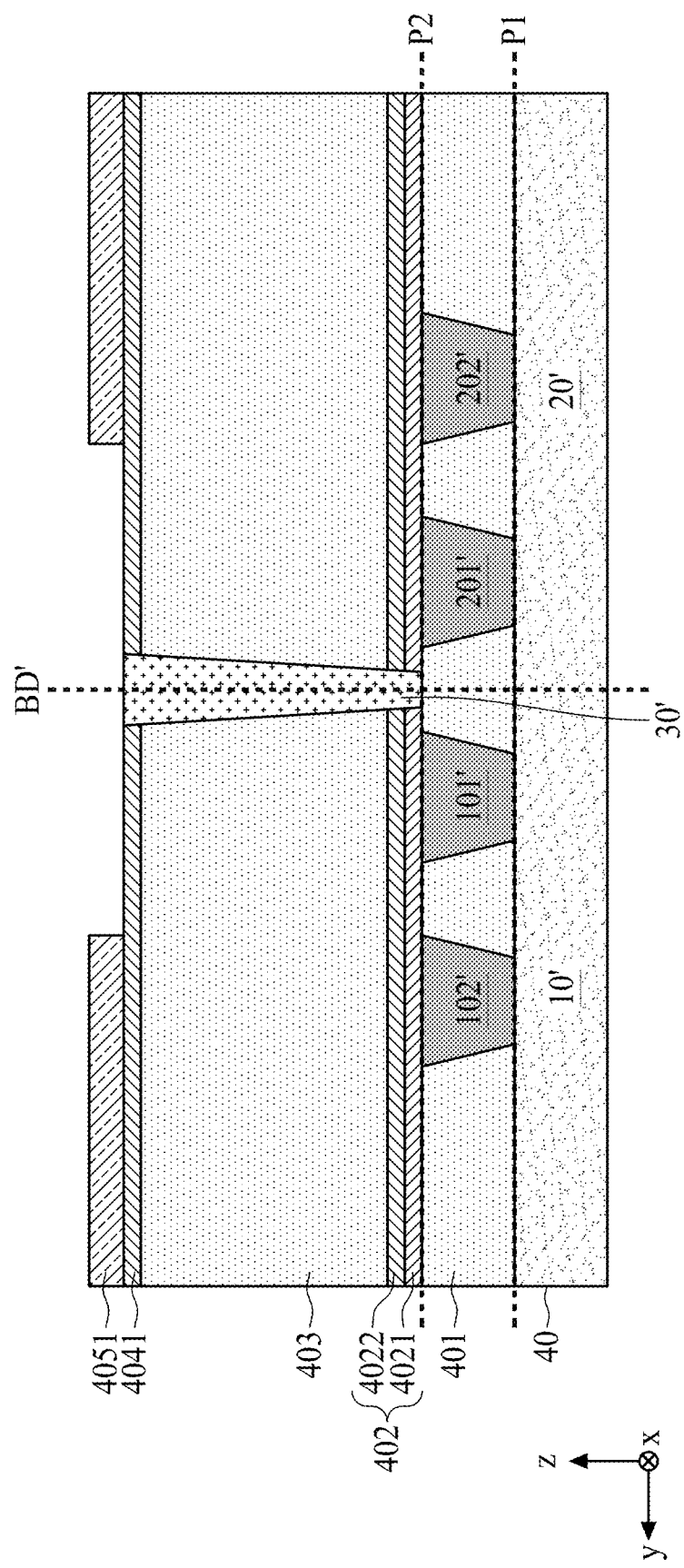
Figure 2N:
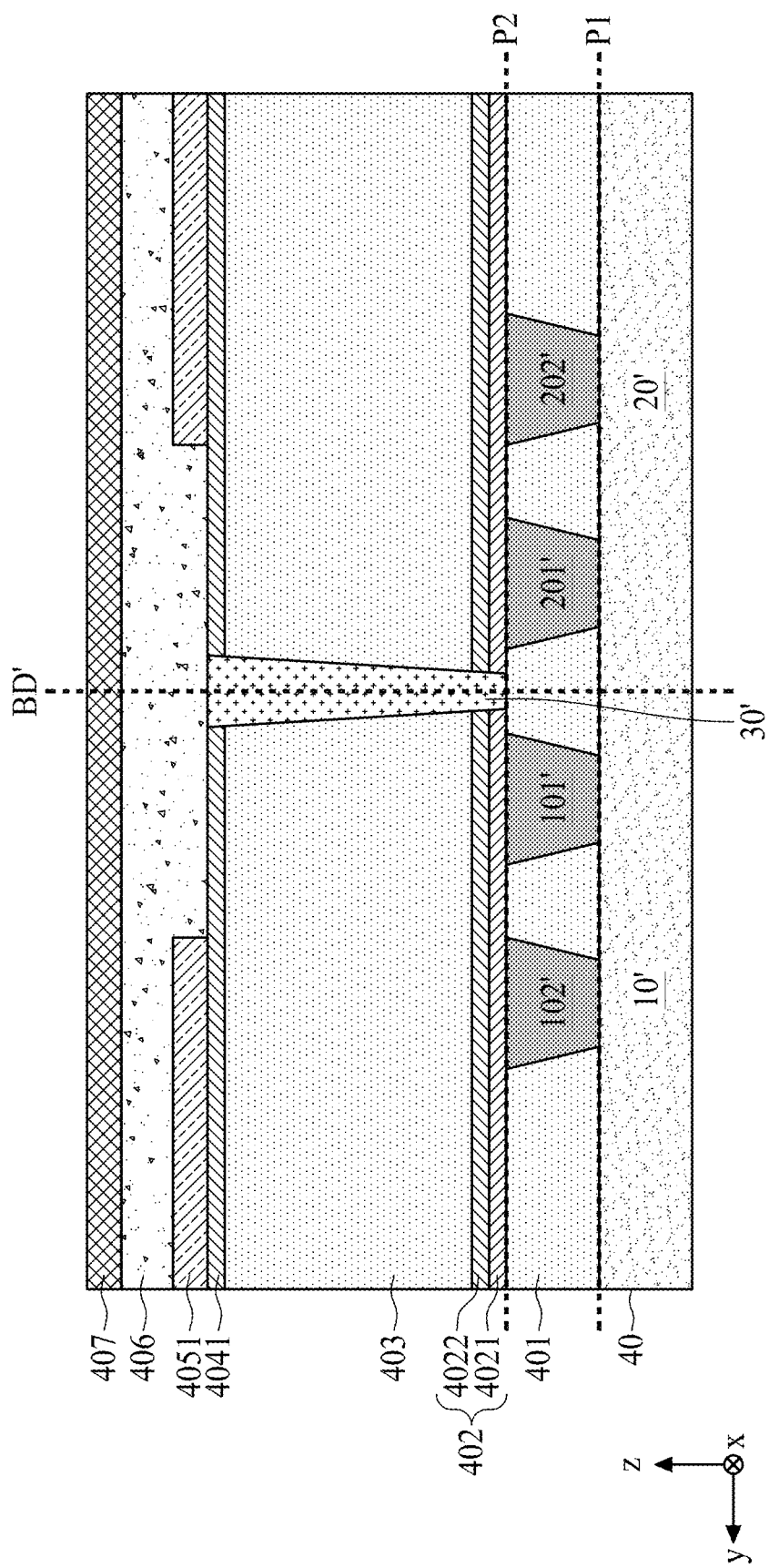
Figure 2O:
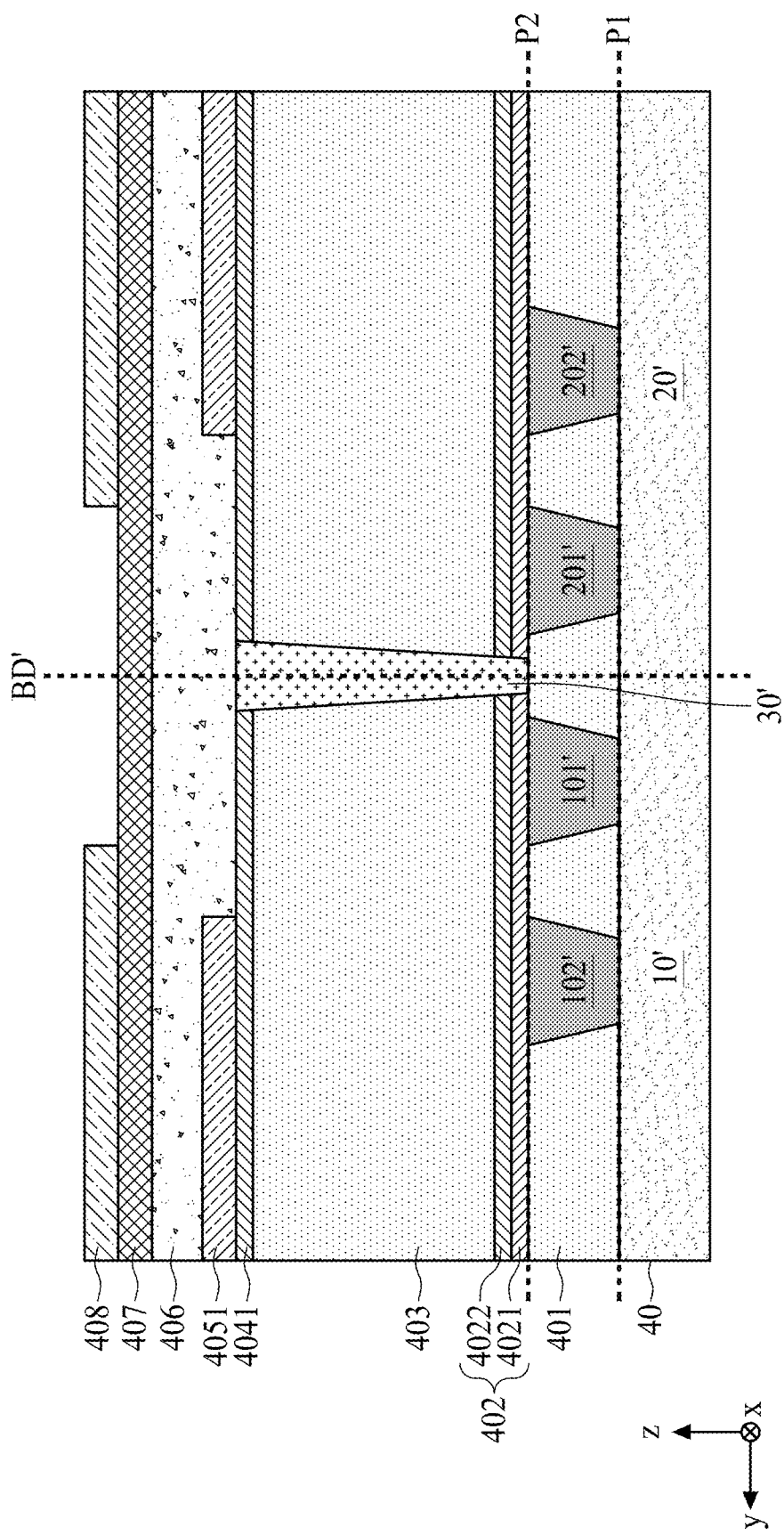
Figure 2P:
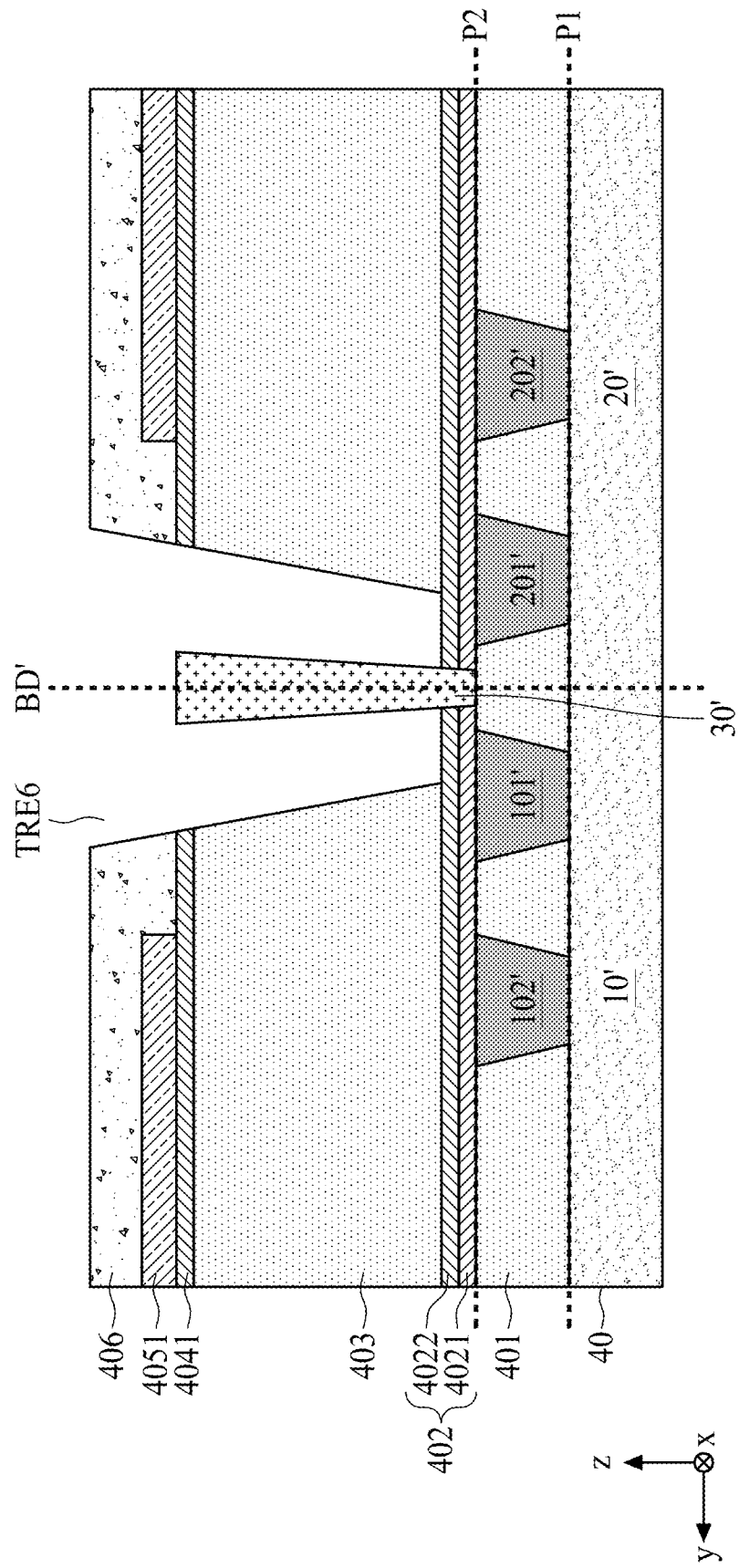
Figure 2Q:
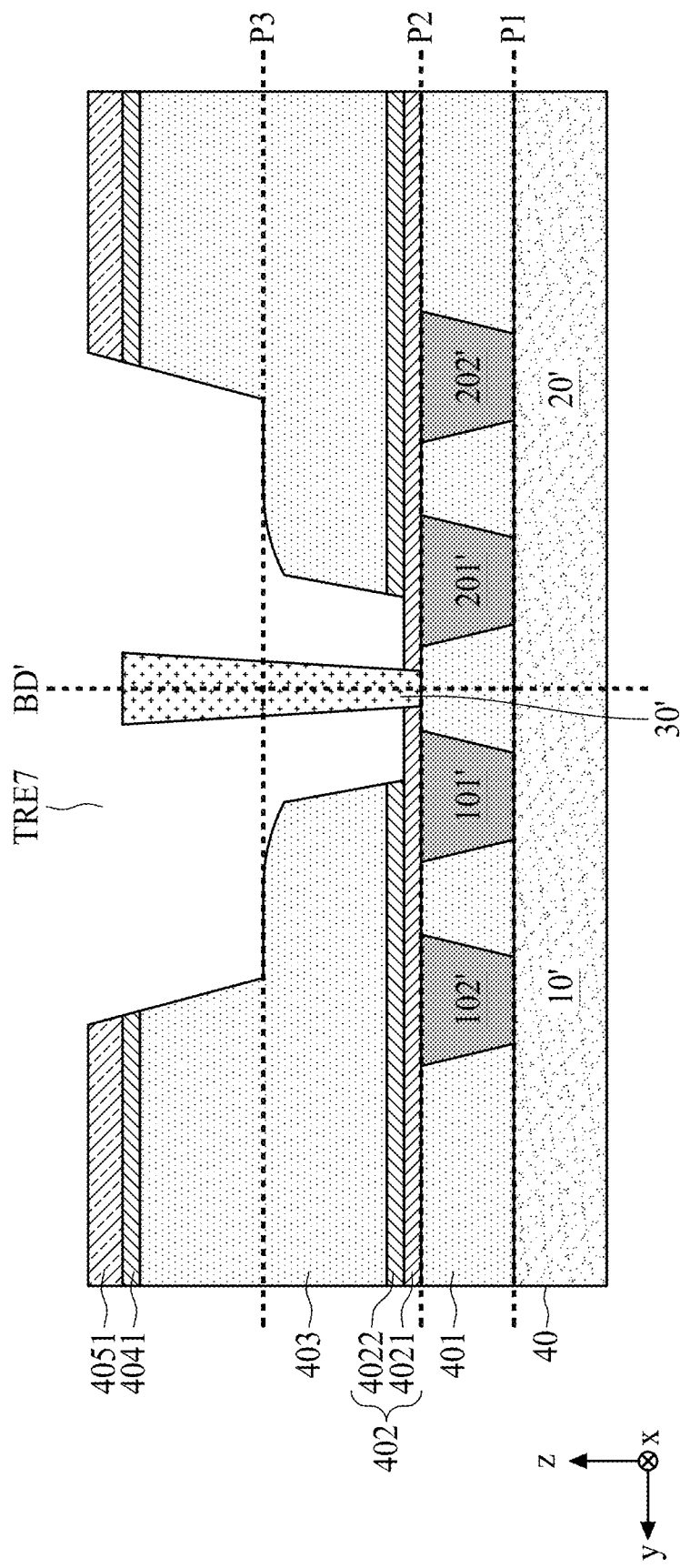
Figure 2R:
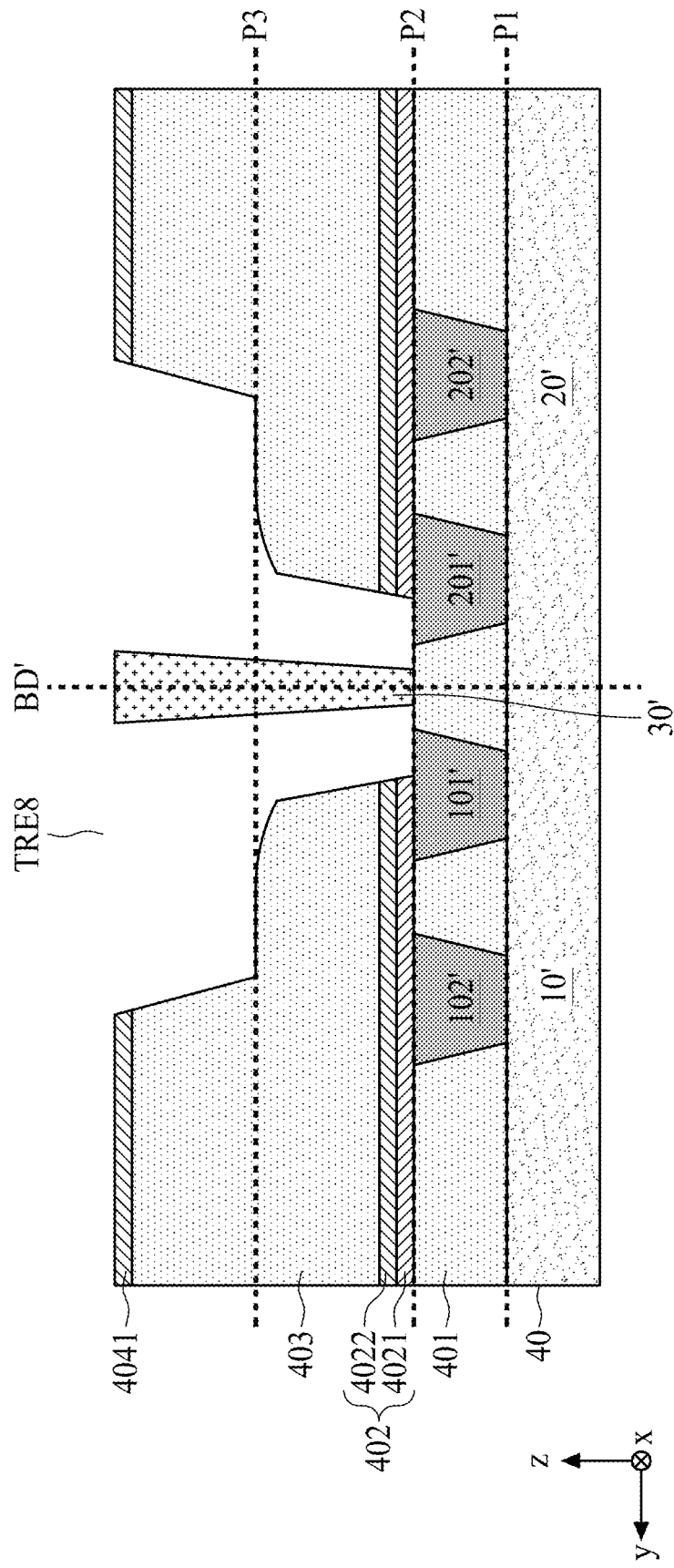
Figure 2S:
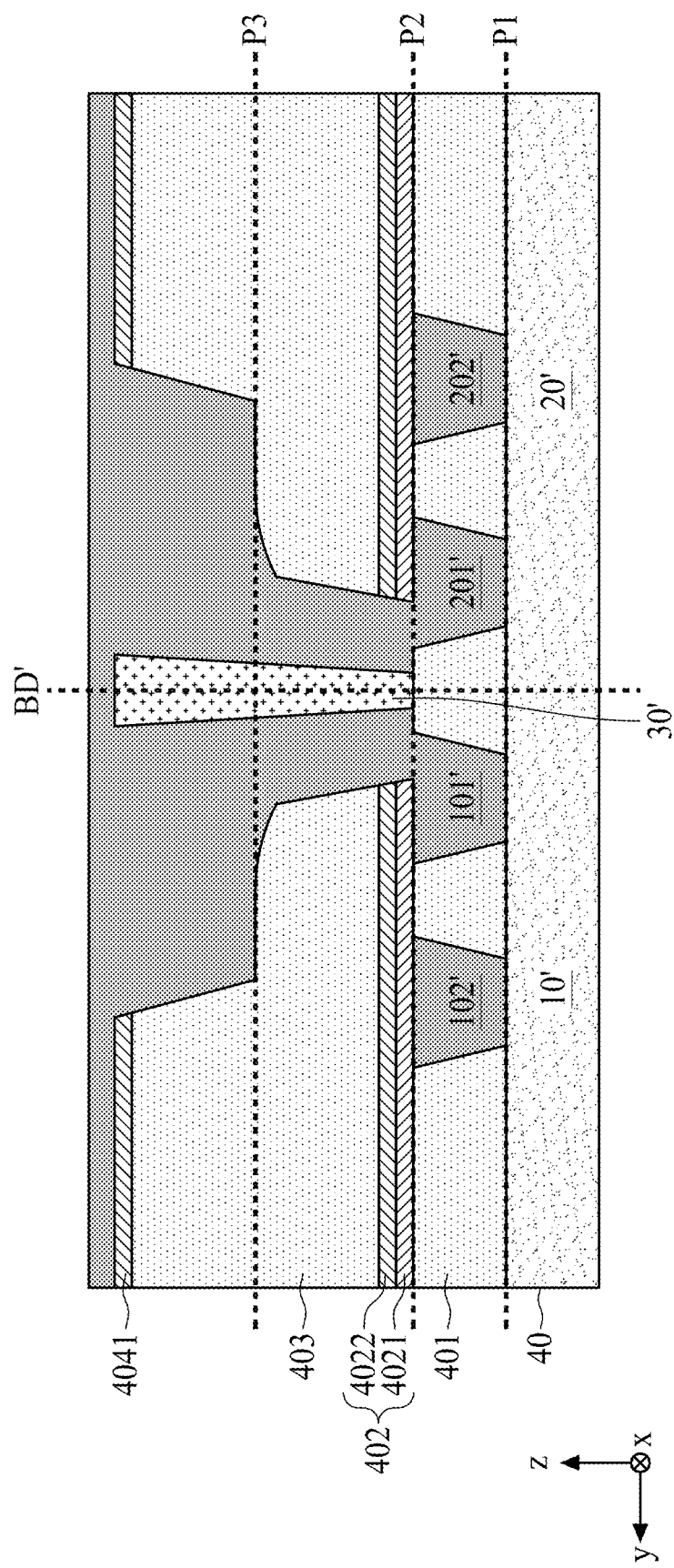
Figure 2T:
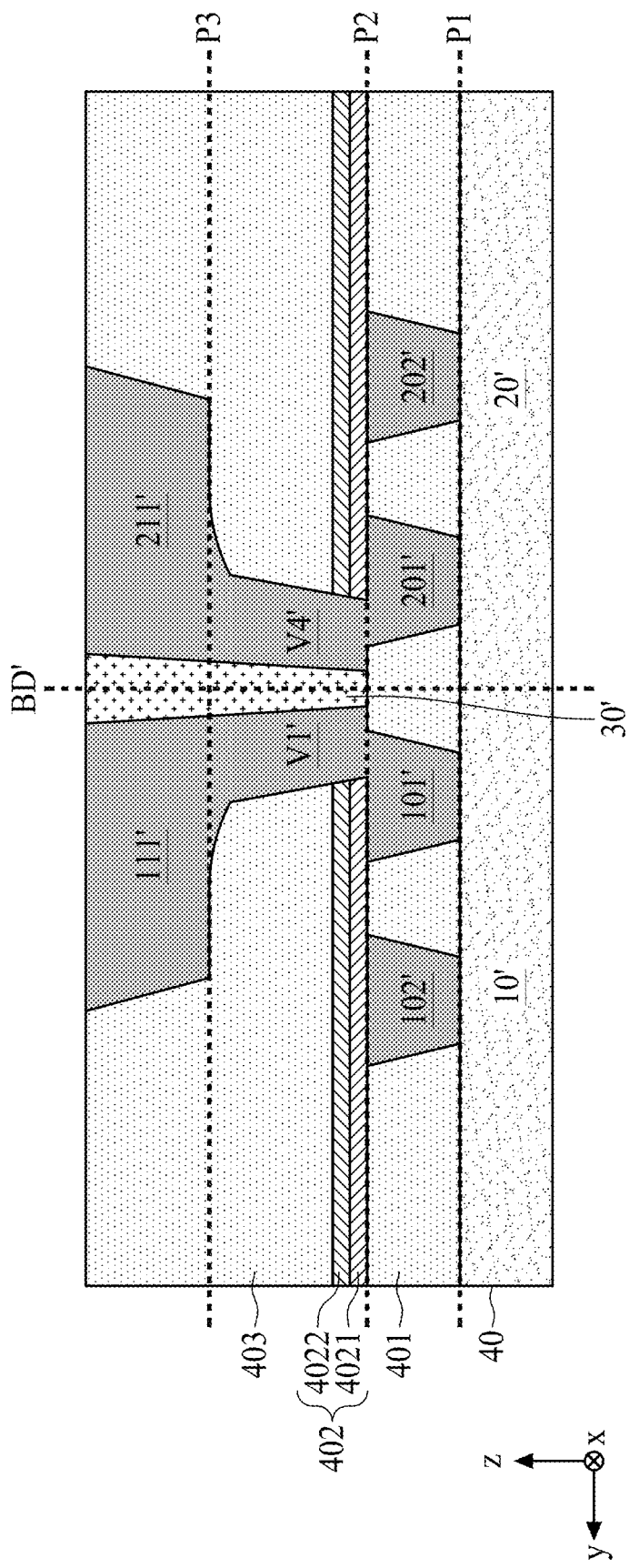

Refer to FIGS. 2A to 2T, which illustrate a first part of a process of manufacturing a semiconductor device in accordance with an embodiment of the present disclosure. The semiconductor device 1 mentioned in FIG. 1 can be implemented by the process illustrated in FIGS. 2A to 2T.

In FIG. 2A, a substrate 40 is provided. The substrate 40 includes the cell 10' and the cell 20', wherein each of the cell 10' and the cell 20' includes transistors for logical functions. In FIG. 2B, a dielectric layer 401 is disposed on a plane P1 over the substrate 40, wherein a top surface of the dielectric layer 401 is defined as a plane P2. In FIG. 2C, a plurality of trenches are formed in the dielectric layer 401 in, for example, a lithography process, using a patterned mask layer as a mask. For example, the trenches TRE1, TRE2, TRE3, and TRE4 are formed in FIG. 2C. In FIG. 2D, a conductive layer is formed on the dielectric layer 401 in, for example, a deposition process, filling the trenches generated in FIG. 2C.

In FIG. 2E, the portion of the conductive layer on the dielectric layer 401 is removed by a polishing process such as a chemical-mechanical polishing (CMP) process to form the plurality of first metal strips in the first metal layer (i.e. M0 layer). For example, the first metal strips 101' and 102' above the cell 10' and first metal strip 201' and 202' above the cell 20' are formed. The first metal strips 101', 102', 201' and 202' extend in x direction. As shown in FIG. 2E, the first metal strips 101' and 201' are separated from and immediately adjacent to each other at the boundary BD' between the cell 10' and the cell 20'.

In FIG. 2F, an etch stop layer (ESL) 402 is disposed on the dielectric layer 401 by, for example, a coating process. In the present embodiment, the ESL 402 further includes a first ESL 4021 on the dielectric layer 401 and a second ESL 4022 on the first ESL 4021. Suitable materials for the first ESL 4021 includes, but not limited to, silicon nitride, silicon carbide, silicon carbonitride, etc. Suitable materials for the second ESL 4022 includes, but not limited to, silicon nitride, silicon carbide, silicon carbonitride, etc.

In FIG. 2G, a dielectric layer 403 is disposed on the ESL 402 in, for example, a coating process. In FIG. 2H, A patterned mask layer 404 is formed on the dielectric layer 403. In the present embodiment, the patterned mask layer 404 includes a first mask layer 4041 on the dielectric layer 403, and a second mask layer 4042 on the first mask layer 4041. Suitable materials for the first mask layer 4041 includes, but not limited to, silicon nitride, silicon oxynitride, titanium nitride, etc. Suitable materials for the second mask layer 4042 includes, but not limited to, silicon nitride, silicon oxynitride, titanium nitride, etc.

In FIG. 2I, a trench TRE5 is formed in the dielectric layer 403 in, for example, a lithography process. A bottom surface of the trench TRE5 is located on the plane P2 and exposes part of a top surface of the dielectric layer 401. In FIG. 2J, a non-conductive layer is formed on the patterned mask layer 404 in, for example, a deposition process, filling the trench TRE5. The trench TRE filled with the non-conductive material serves as a separating wall 30'.

In FIG. 2K, the portion of the non-conductive layer on the patterned mask layer 404 and the second mask layer 4042 are removed by a polishing process such as a chemical-mechanical polishing (CMP) process, exposing the first mask layer 4041 and a top surface of the separating wall 30'. In the present embodiment, the separating wall 30' has a depth D1 ranging from approximately 10 nm to approximately 100 nm. In the present embodiment, the width D2 of the separating wall 30' in y direction is smaller than 10 nm. Suitable materials for the non-conductive material for forming the separating wall 30' includes, but not limited to, at least one of aluminum oxide (AlOx), chromic oxide (ZrOx), erbium oxide (ErOx), hafnium oxide (HfOx), silicon oxide (SiOx), silicon nitride (SiNx), carbon oxidation silicon (SiOxCy), and silicon oxynitride (SiCN).

In FIG. 2L, a patterning film (PF) layer 405 is formed on the first mask layer 4041 in, for example, a coating process. In the present embodiment, the PF layer 405 includes a first PF layer 4051 on the first mask layer 4041 and a second PF layer 4052 on the first PF layer 4051. In FIG. 2M, the PF layer 405 is patterned resulting in a patterned first PF layer 4051. The first PF layer 4051 defines a recess that exposes a portion of the first mask layer 4041 and the separating wall 30'.

In FIG. 2N, a lithographic bottom layer 406 is formed on the patterned first PF layer 4051 and the exposed portion of the patterned first mask layer 4041 in, for example, a coating process. In the present embodiment, suitable material for the lithographic bottom layer 406 includes, but not limited to, carbon-based material. Subsequently, a lithographic middle layer 407 is formed on the lithographic bottom layer 406 in, for example, a coating process. In the present embodiment, suitable material for the lithographic middle layer 407 includes, but not limited to, silicon-based material. In FIG. 2O, a patterned photoresist (PR) layer 408 is formed on the lithographic middle layer 407 in, for example, a coating process. The patterned PR layer 408 exposes a portion of the lithographic middle layer 407 that is disposed over the separating wall 30'.

In FIG. 2P, a trench TRE6 for disposing contact vias is formed in the dielectric layer 403 around the separating wall 30' in, for example, a lithography process followed by a polish process to remove the patterned PR layer 408 and the lithographic middle layer 407. A bottom surface of the trench TRE6 exposes part of a top surface of the second ESL 4022. In FIG. 2Q, a trench TRE7 for disposing the contact vias and a plurality of second metal strips is formed around the separating wall 30' in, for example, a lithography process followed by a polish process to remove the lithographic bottom layer 406 and the exposed part of the second ESL 4022. A bottom surface of the trench TRE7 exposes part of a top surface of the first ESL 4021.

In FIG. 2R, a trench TRE8 is formed around the separating wall 30' in, for example, polish process to remove the first PF layer 4051 and the exposed portion of the first ESL 4021. A bottom surface of the trench TRE8 exposes the first metal strips 101' and 201'. The trench TRE8 includes a bottom surface located on the plane P3 and another bottom surface located on the plane P2. In FIG. 2S, a conductive layer is formed on the first mask layer 4041 in, for example, a deposition process, filling the trench TRE8 generated in FIG. 2R.

In FIG. 2T, the portion of the conductive layer on the first mask layer 4041 and the first mask layer 4041 are removed by a polishing process such as a CMP process to form the plurality of second metal strips in the second metal layer (i.e. M1 layer) and the contact vias connected thereto. For example, the contact via V1' is disposed on the first metal strip 101' and the contact via V4' is disposed on the first metal strip 201'. In addition, the second metal strips 111' is disposed on the contact via V1', and the second metal strip 211' is disposed on the contact via V4'. The second metal strips 111' and 211' extend in y direction. As shown in FIG. 2T, the second metal strips 111' and 211' are separated from each other by the separating wall 30'. Likewise, the contact vias V1' and V4' are separated from each other by the separating wall 30'.

Refer to FIG. 2P again, the trench TRE6 is formed with the patterned PR layer 408 exposing a portion of the lithographic middle layer 407 that is disposed over the separating wall 30. Accordingly, the contact via V1' formed by filling conductive material in the trench is attached to the sidewall of the separating wall 30'. Therefore, the distance between the contact via V1' and the separating wall 30', or so-called the via enclosure, is approximately zero. Likewise, the contact via V4' is attached to the sidewall of the separating wall 30'. Therefore, the distance between the contact via V4' and the separating wall 30' is approximately zero. In addition, because of the existence of the separating wall 30', the second metal strips 111' and 211' are prevented from being short-circuited. Therefore, the problems in prior art can be efficiently solved.

Figure 3A:
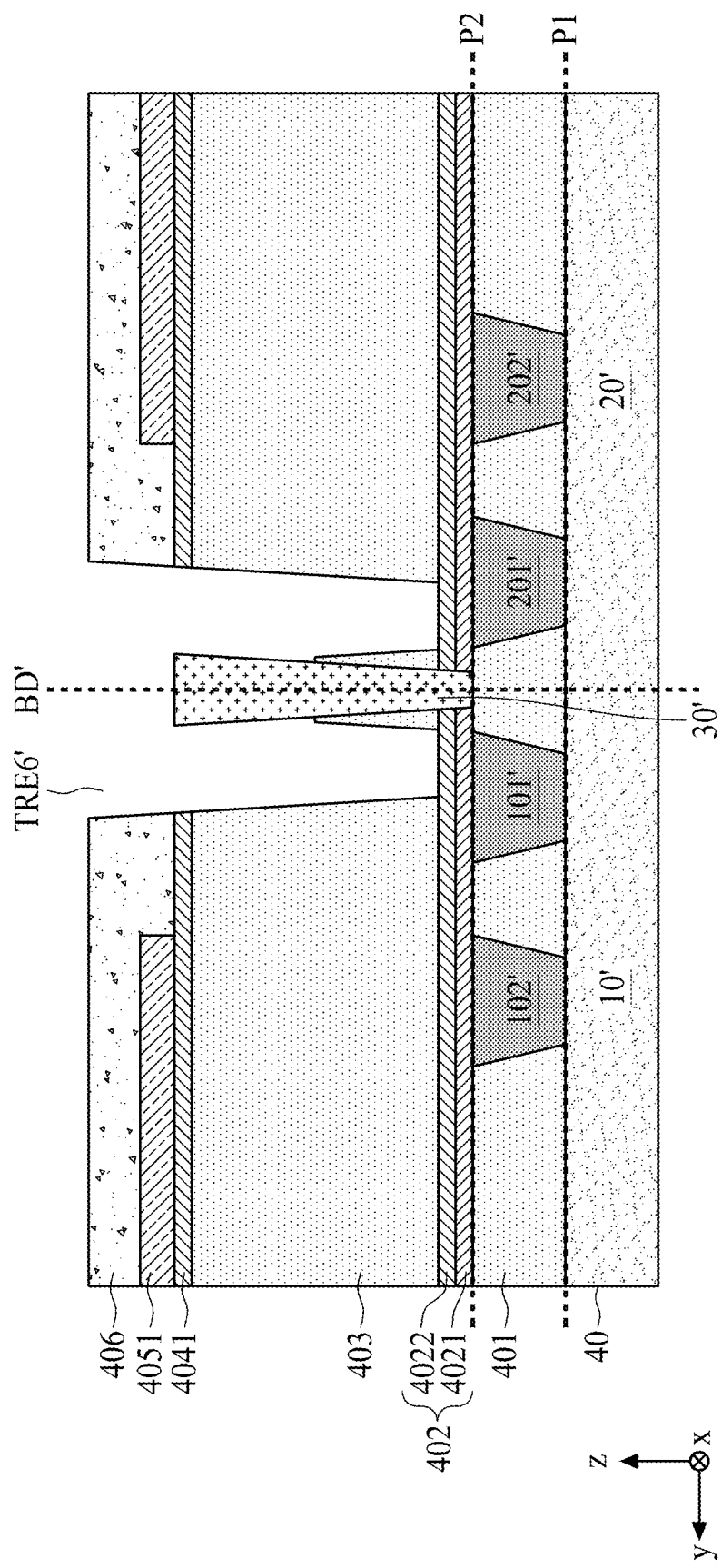
FIG. 3A to FIG. 3E are diagrams illustrating a process of forming a trench around the separating wall in accordance with an embodiment of the present disclosure.

However, in actual situation, the trench TRE6 may not be as clean as shown in FIG. 2P. That is, residual dielectric material form the dielectric layer 403 will be left on the sidewall of the separating wall 30' after the lithography operation. In FIG. 3A, a trench TRE6' for disposing contact vias is formed in the dielectric layer 403 around the separating wall 30' in, for example, a lithography process followed by a polish process to remove the patterned PR layer 408 and the lithographic middle layer 407. As shown in FIG. 3A, the residual dielectric material is left on the separating wall 30' after the lithography process. A bottom surface of the trench TRE6' exposes part of a top surface of the second ESL 4022.

Figure 3B:
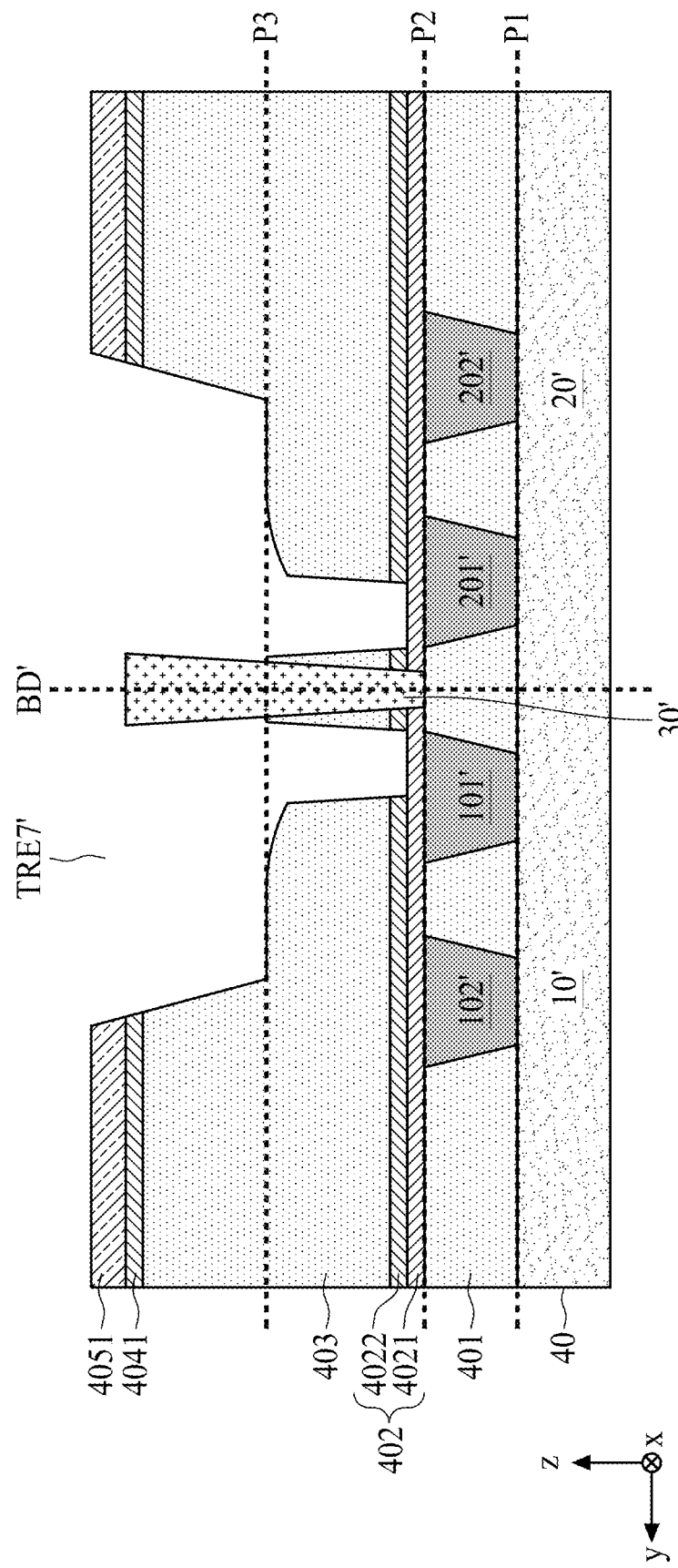
Figure 3C:
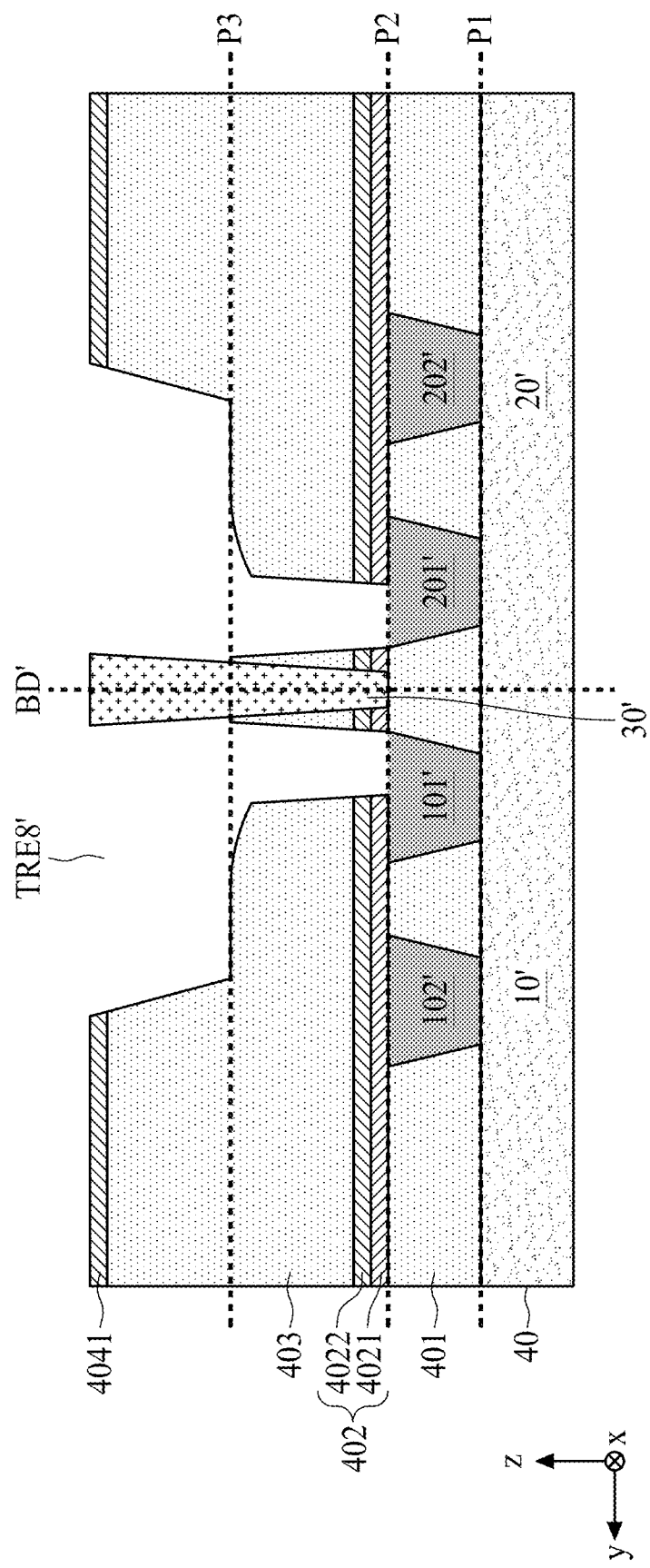
Figure 3D:
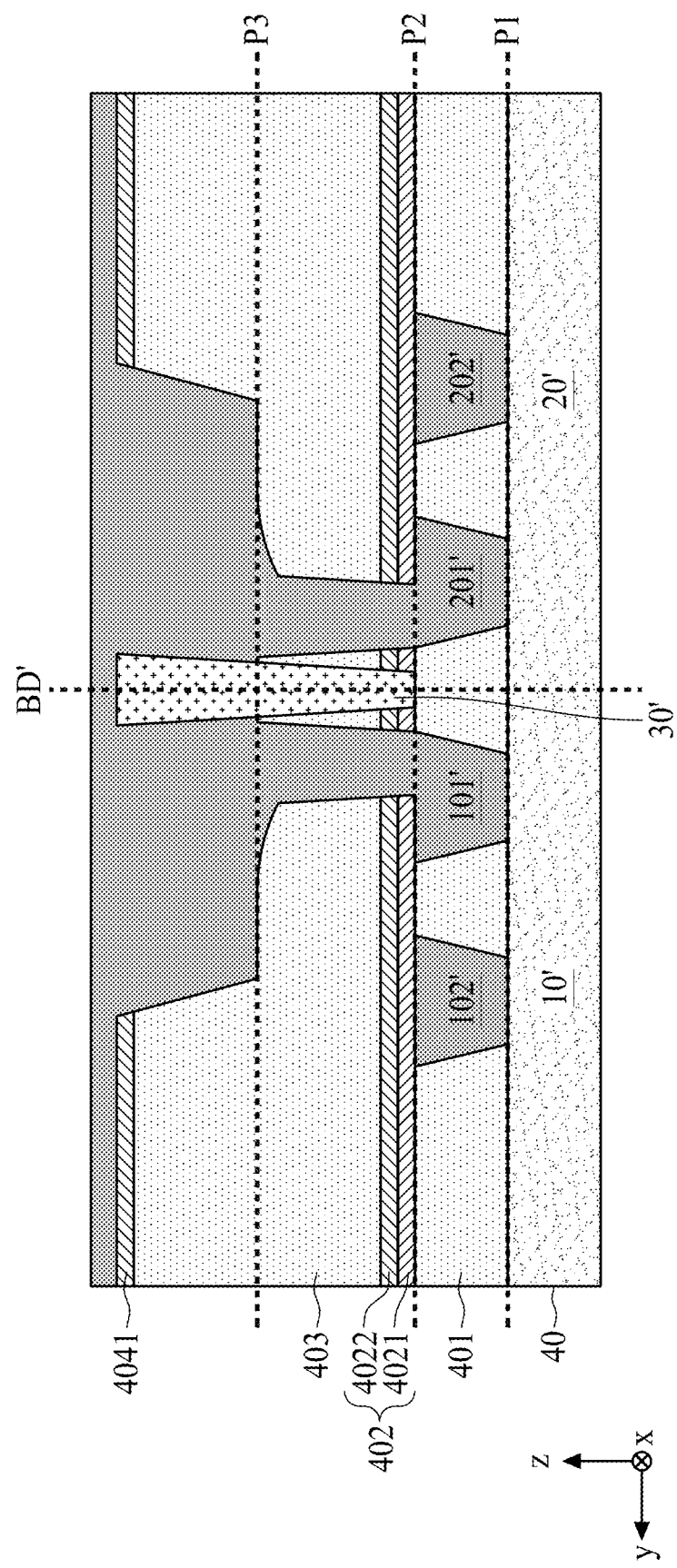

In FIG. 3B, a trench TRE7' for disposing the contact vias and a plurality of second metal strips is formed around the separating wall 30' in, for example, a lithography process followed by a polish process to remove the lithographic bottom layer 406 and the exposed part of the second ESL 4022. In FIG. 3C, a trench TRE8' is formed around the separating wall 30' in, for example, a polish process to remove the first PF layer 4051 and the exposed portion of the first ESL 4021. A bottom surface of the trench TRE8' exposes the first metal strips 101' and 201'. The trench TRE8' includes a bottom surface located on the plane P3 and another bottom surface located on the plane P2. In FIG. 3D, a conductive layer is formed on the first mask layer 4041 in, for example, a deposition process, filling the trench TRE8' generated in FIG. 3C.

Figure 3E:
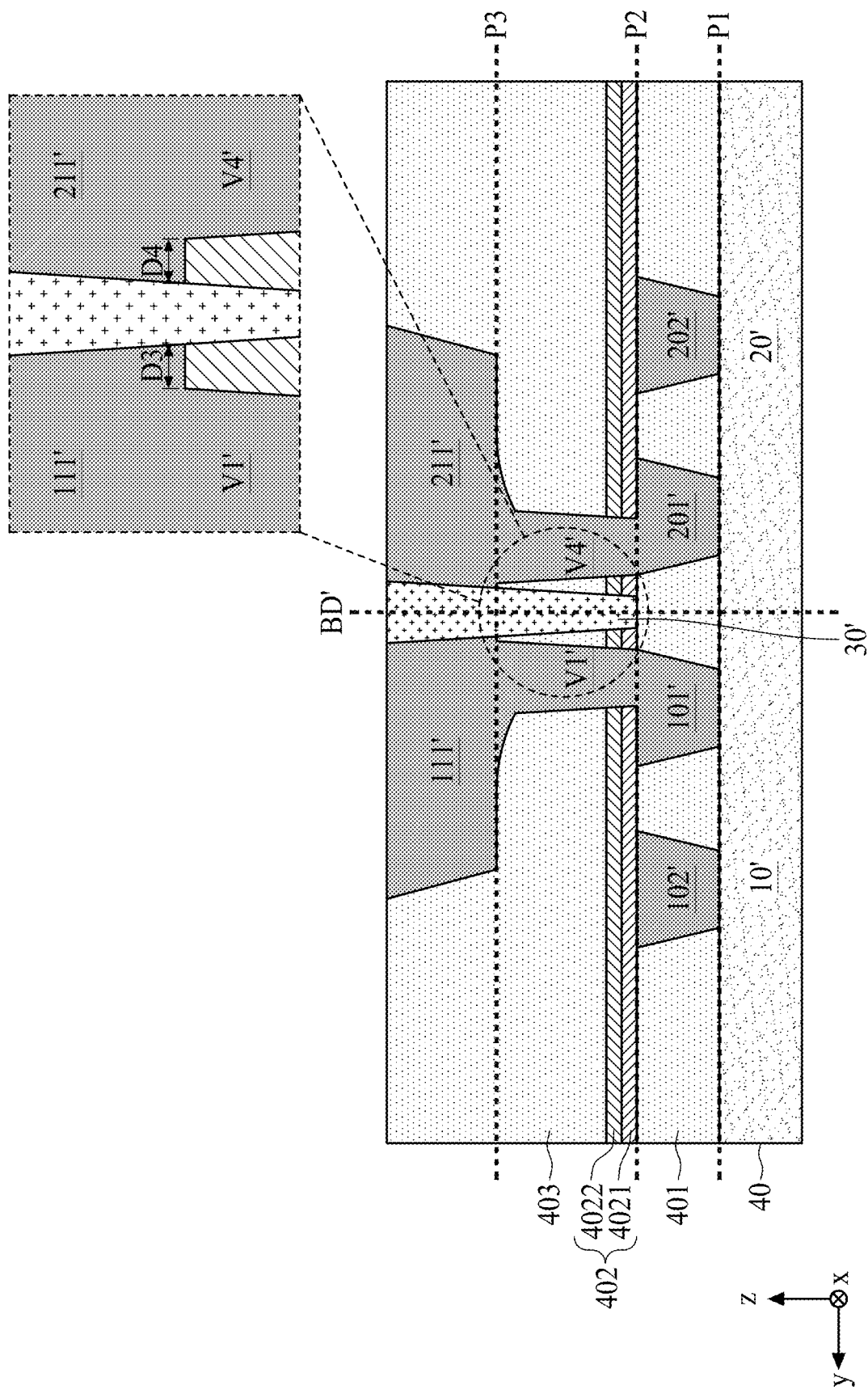

In FIG. 3E, the portion of the conductive layer on the first mask layer 4041 and the first mask layer 4041 are removed by a polishing process such as a CMP process to form the plurality of second metal strips in the second metal layer (i.e. M1 layer), and the contact vias connected thereto. Refer to the close-up sub-diagram of the separating wall 30', a distance D3 between the contact via V1' and the separating wall 30' exists due to the residual dielectric material left on the sidewall of the separating wall 30'. Likewise, a distance D4 between the contact via V4' and the separating wall 30' exists due to the residual dielectric material left on the sidewall of the separating wall 30'. In the present embodiment, each of the distances D3 and D4 is smaller than 5 nm.

Refer to FIGS. 4A to 4J, which illustrate a second part of the process of manufacturing the semiconductor device in accordance with an embodiment of the present disclosure. The second part of the process follows the operations shown in FIG. 2T or FIG. 3E.

Figure 4A:
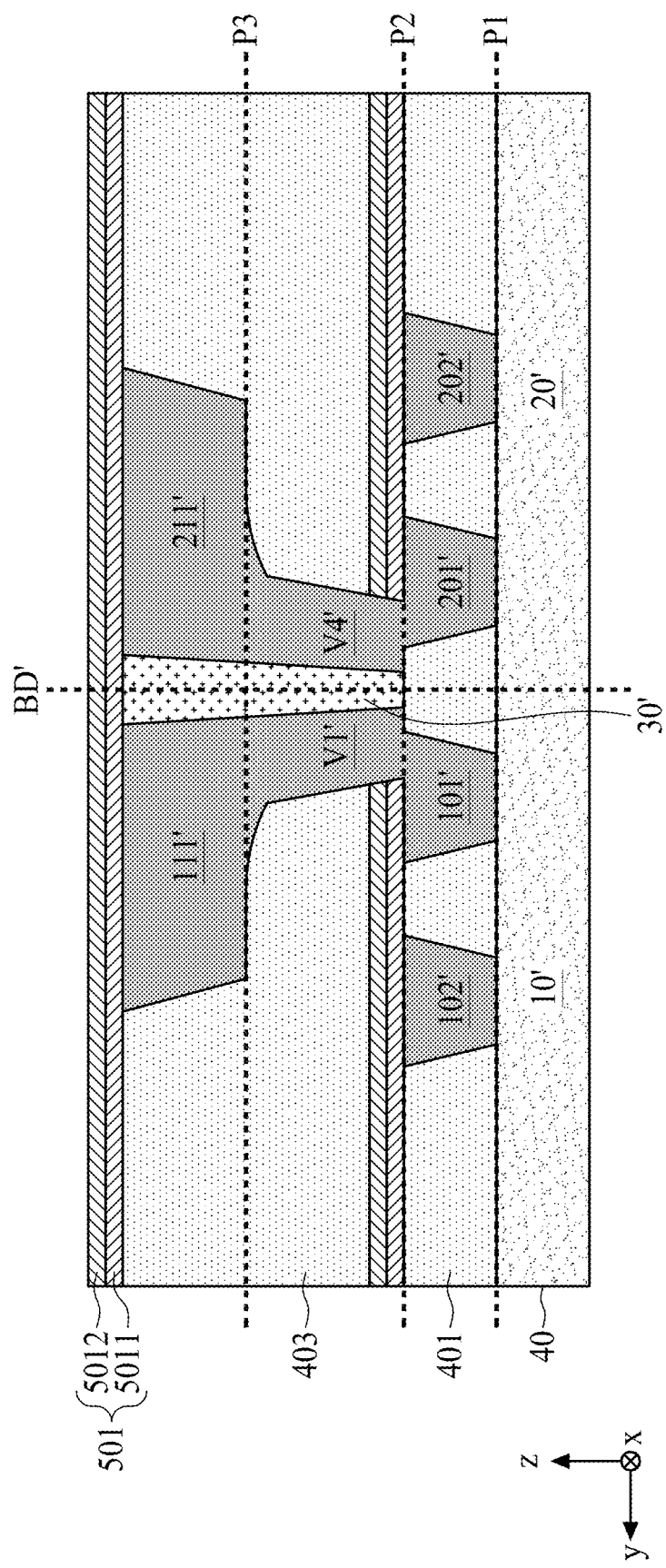
FIG. 4A to FIG. 4K are diagrams illustrating a second part of the process of manufacturing a semiconductor device in accordance with an embodiment of the present disclosure.

In FIG. 4A, an ESL 501 is formed on the dielectric layer 403 in, for example, a coating process. In the present embodiment, the ESL 501 includes a first ESL 5011 formed on the dielectric layer 403 and a second ESL 5012 formed in the first ESL 5011. Suitable materials for the first ESL 5011 includes, but not limited to, silicon nitride, silicon carbide, silicon carbonitride, etc. Suitable materials for the second ESL 5012 includes, but not limited to, silicon nitride, silicon carbide, silicon carbonitride, etc.

Figure 4B:
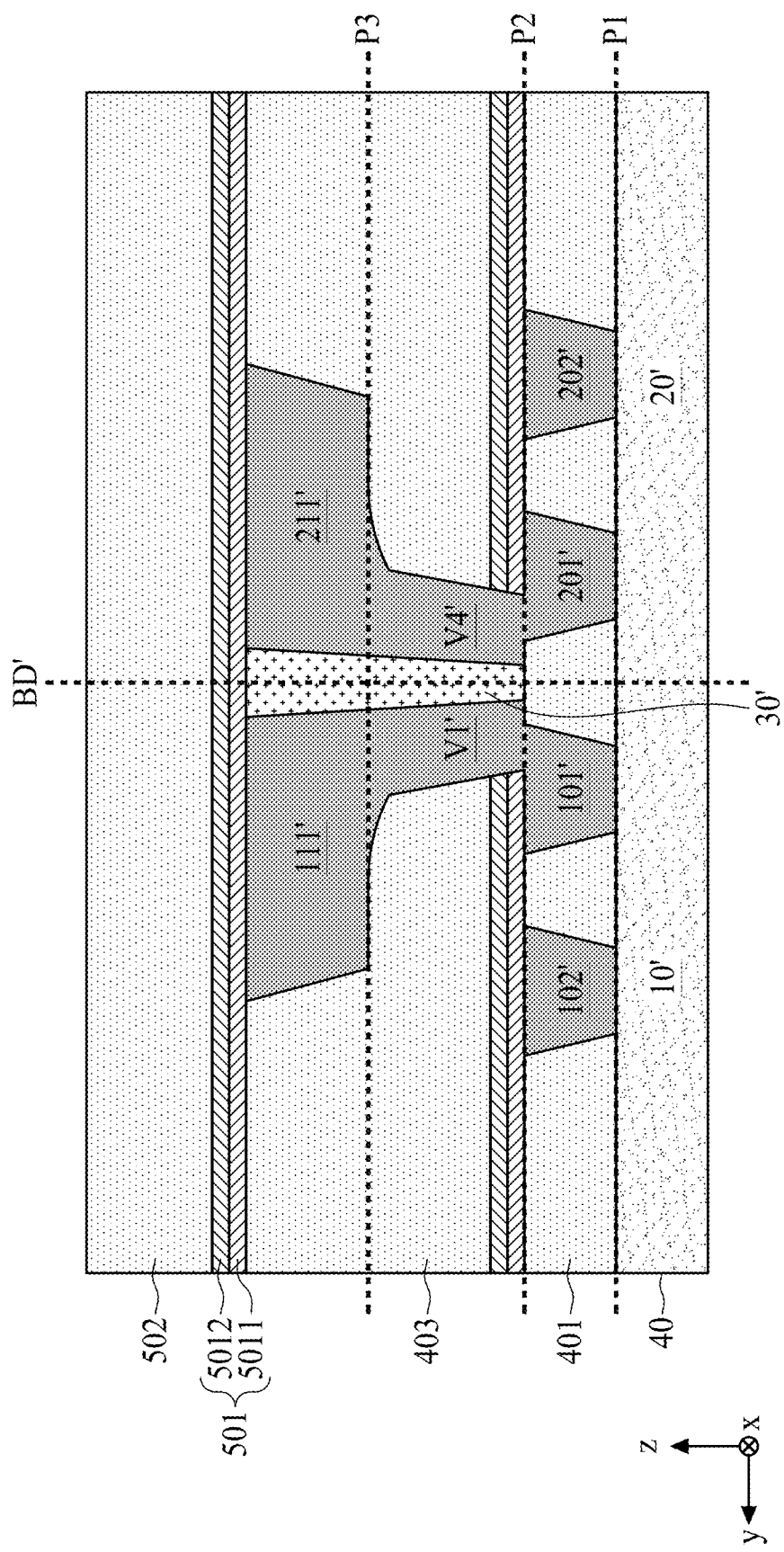
Figure 4C:
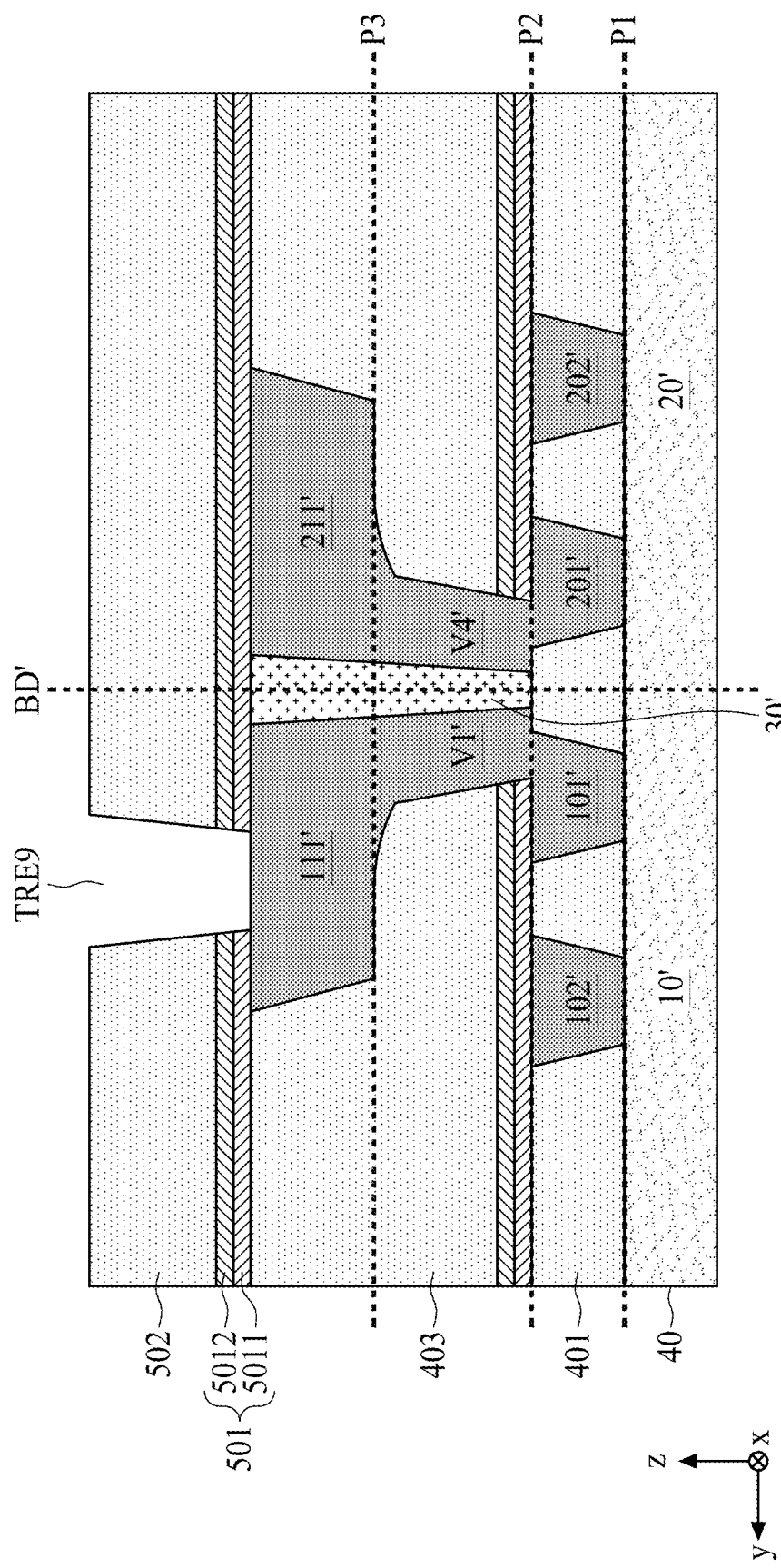
Figure 4D:
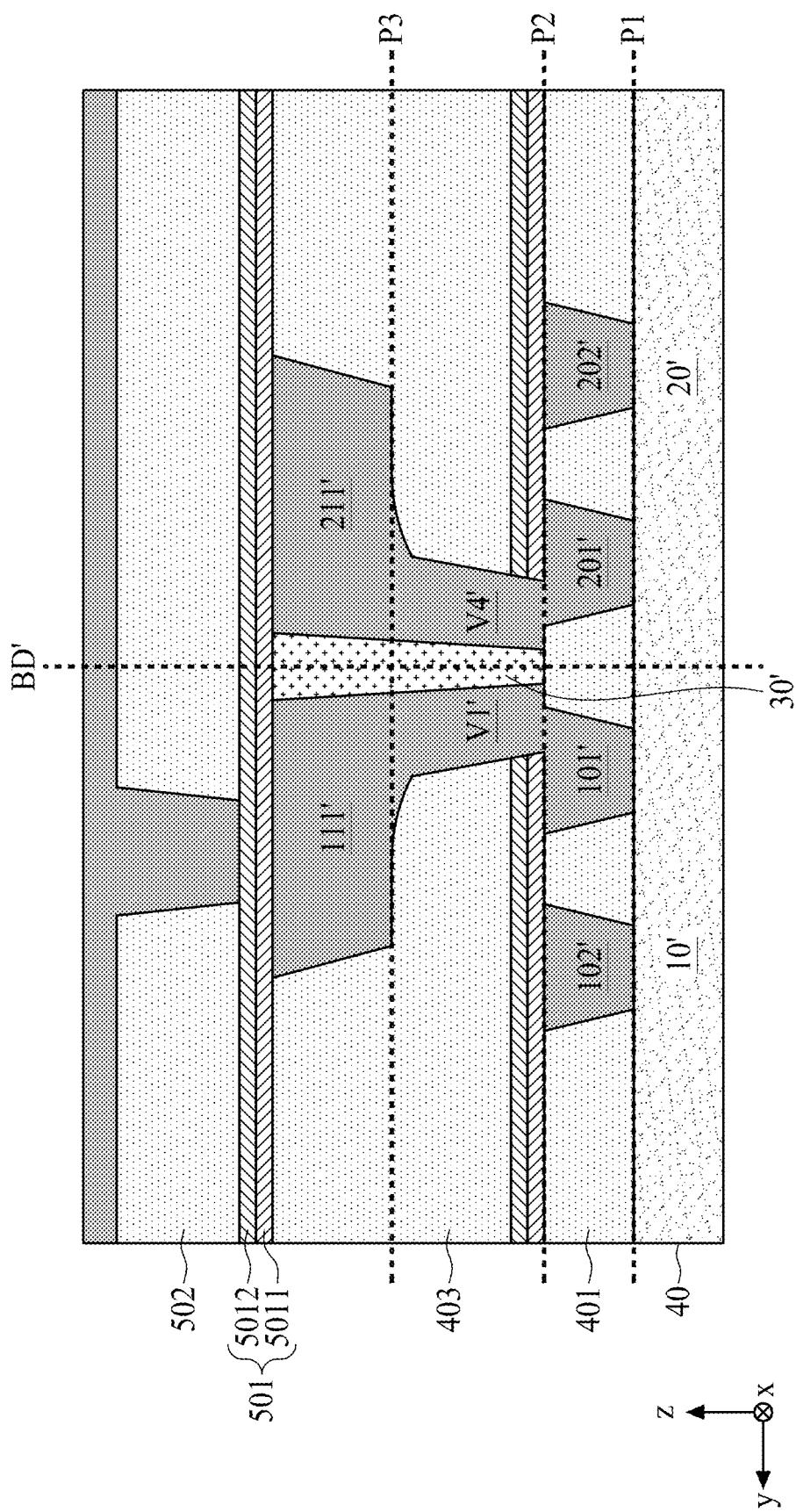
Figure 4E:
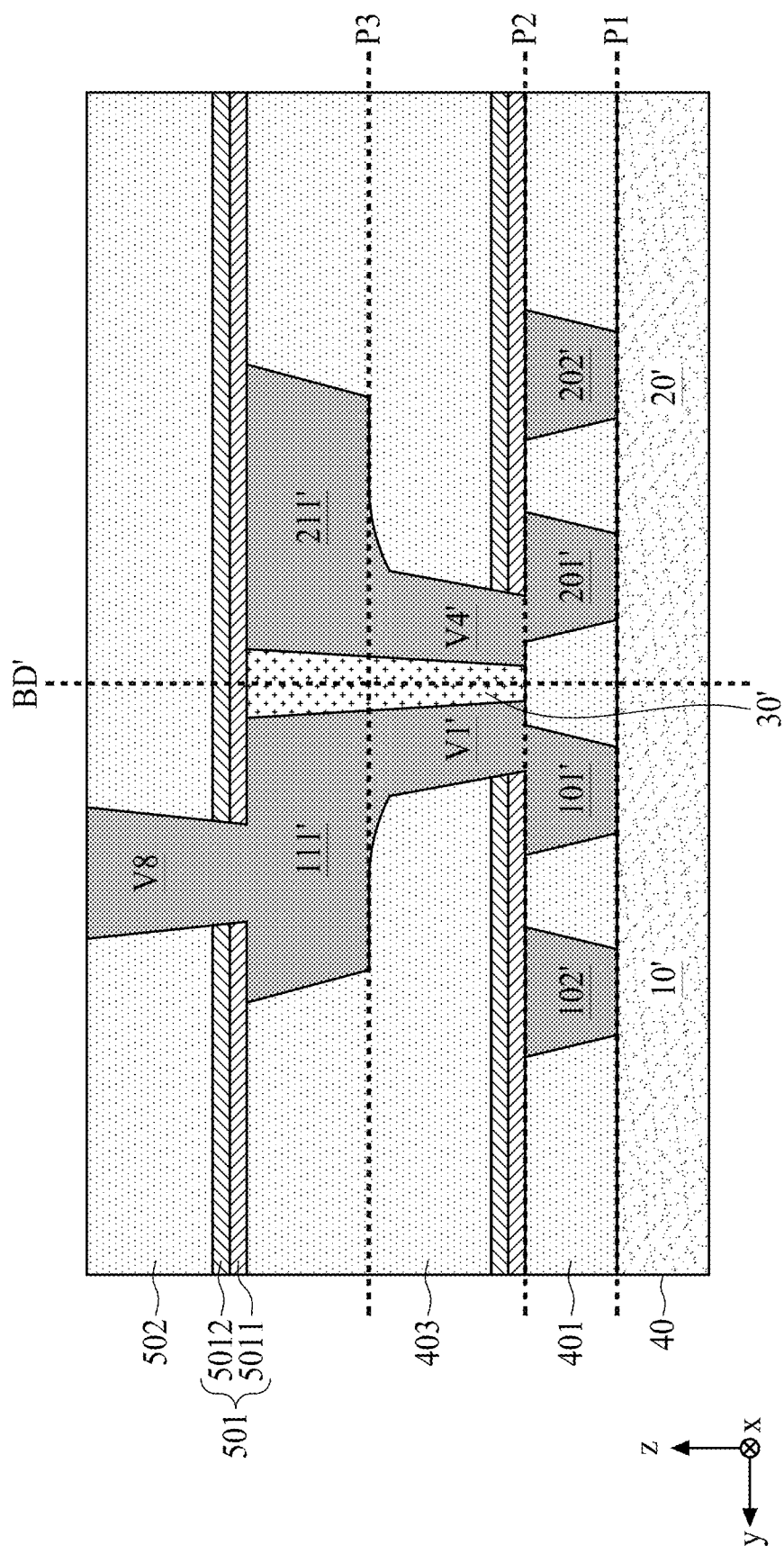

In FIG. 4B, a dielectric layer 502 is formed on the ESL 501 in, for example, a coating process. In FIG. 4C, a plurality of trenches are formed in the dielectric layer 502 in, for example, a lithography process, using a patterned mask layer as a mask. For example, the trench TRE9 is formed in FIG. 4C. In FIG. 4D, a conductive layer is formed on the dielectric layer 502 in, for example, a deposition process, filling the trenches generated in FIG. 4C. In FIG. 4E, the portion of the conductive layer on the dielectric layer 502 is removed by a polishing process such as a chemical-mechanical polishing (CMP) process to form a contact via V8 on the second metal strip 111'.

Figure 4F:
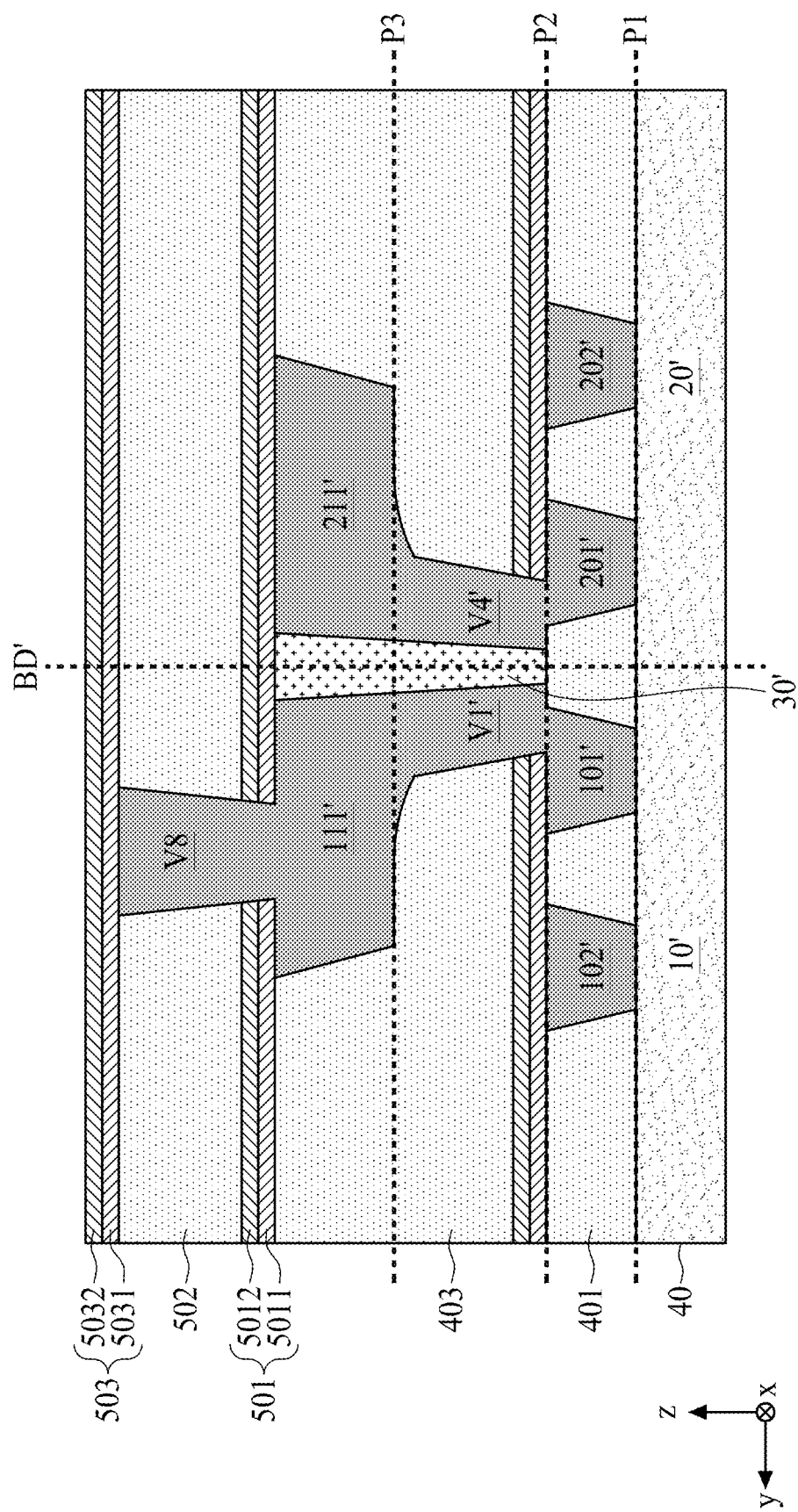
Figure 4G:
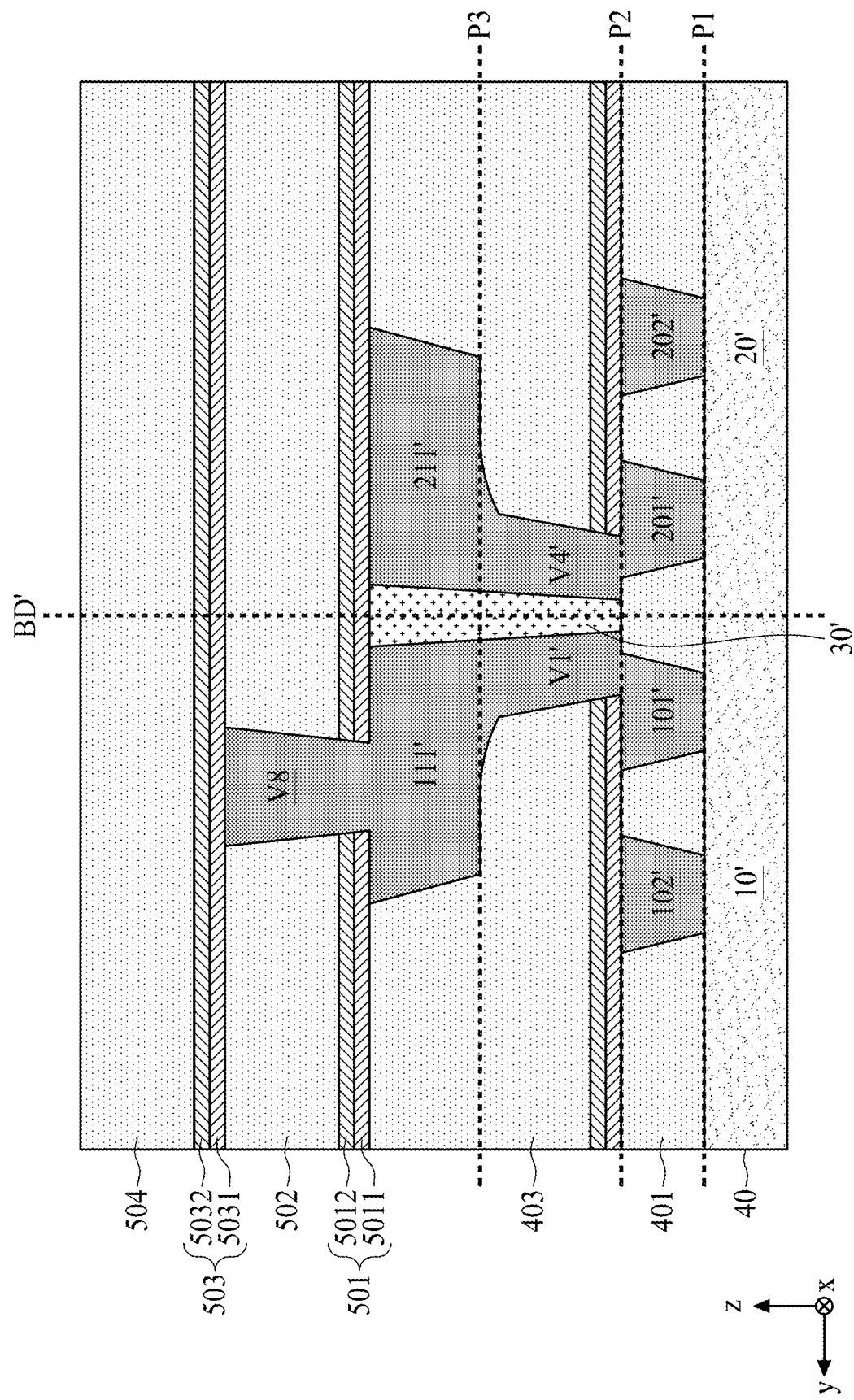

In FIG. 4F, an ESL 503 is formed on the dielectric layer 502 in, for example, a coating process. The ESL 503 further includes a first ESL 5031 formed on the dielectric layer 502 and a second ESL 5032 formed on the first ESL 5031. In FIG. 4G, a dielectric layer 504 is formed on the ESL 503 in, for example, a coating process.

Figure 4H:
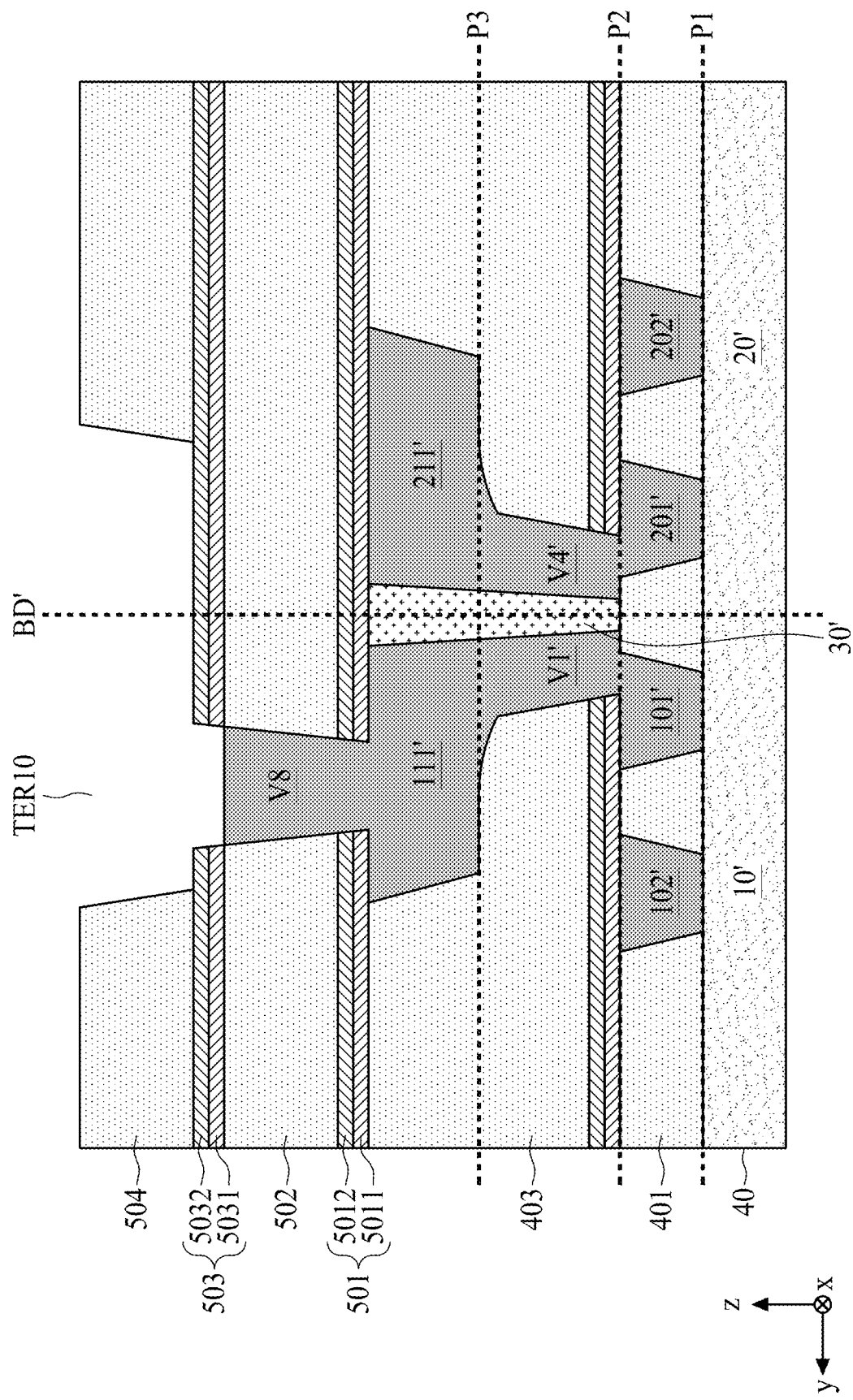
Figure 4I:
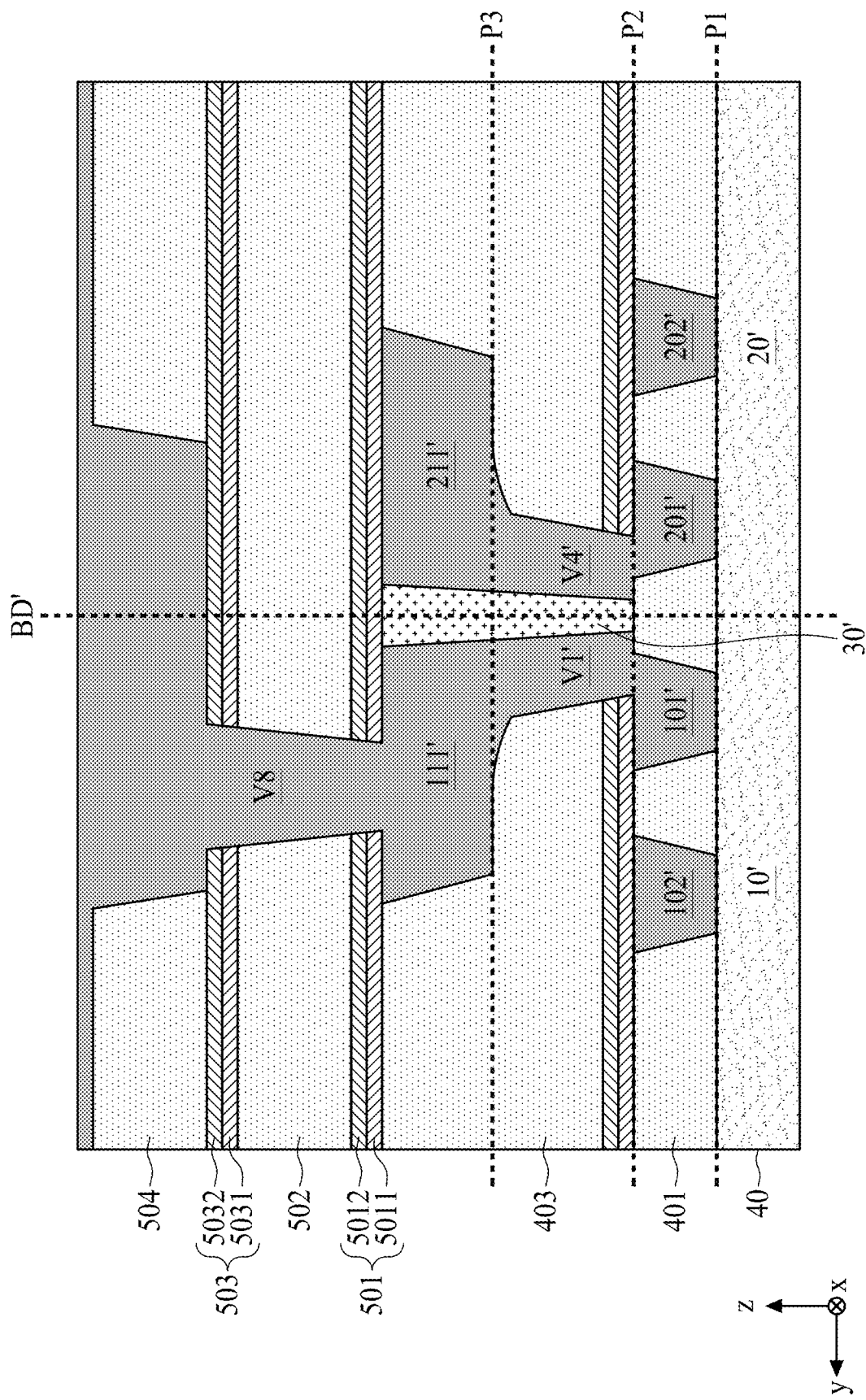
Figure 4J:
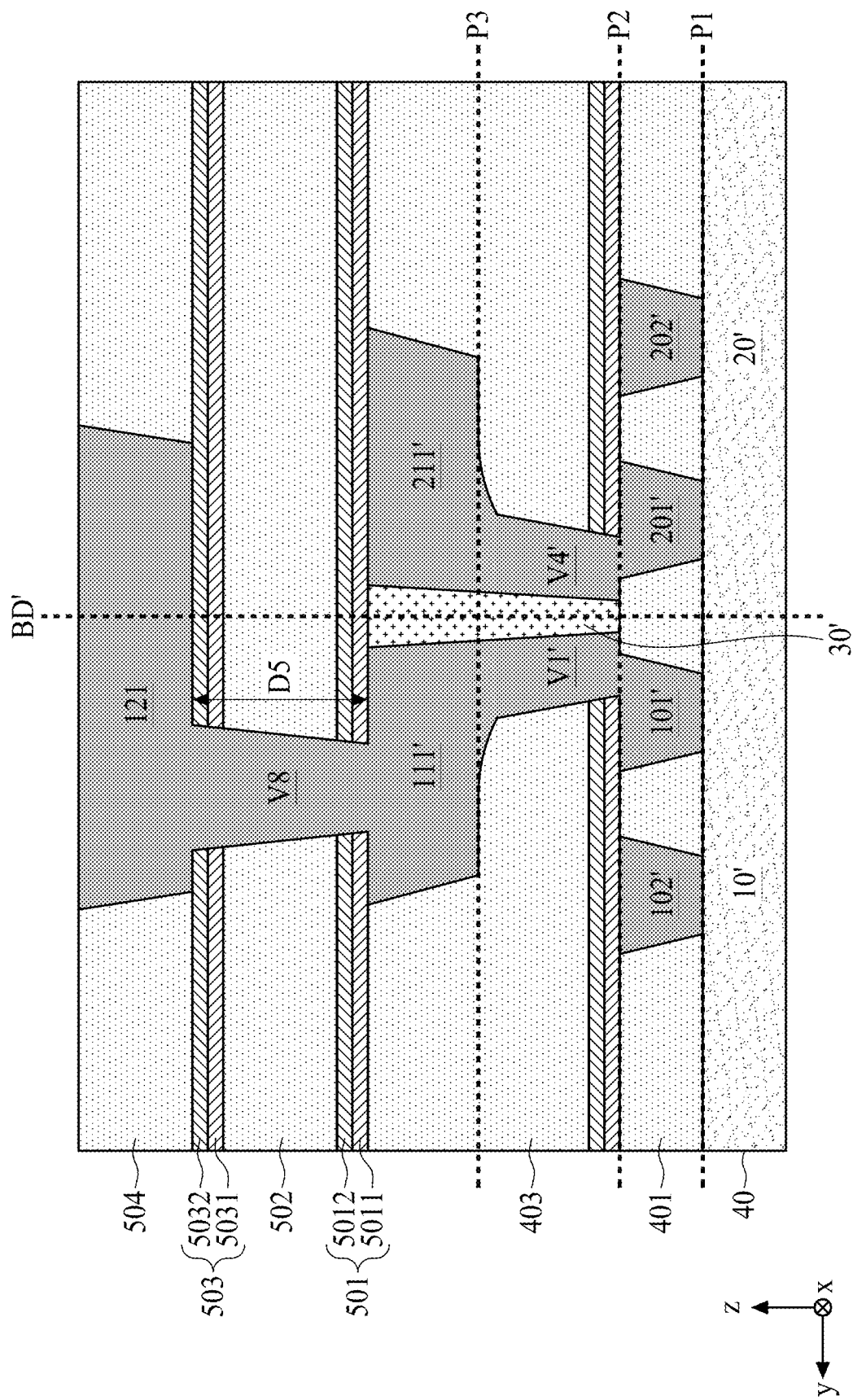

In FIG. 4H, a plurality of trenches are formed in the dielectric layer 504 in, for example, a lithography process, using a patterned mask layer as a mask. For example, the trench TRE10 is formed in FIG. 4H. In FIG. 4I, a conductive layer is formed on the dielectric layer 504 in, for example, a deposition process, filling the trenches generated in FIG. 4H. In FIG. 4J, the portion of the conductive layer on the dielectric layer 504 is removed by a polishing process such as a chemical-mechanical polishing (CMP) process to form a plurality of third metal strips in a third metal layer (i.e., M2 layer). For example, a third metal strip 121 extending in y direction is formed on the contact via V8. The length D5 of the contact via V8 connected between the second metal strip 111' in M1 layer and the third metal 121 in M2 layer ranges from approximately 10 nm to approximately 100 nm.

Figure 4K:
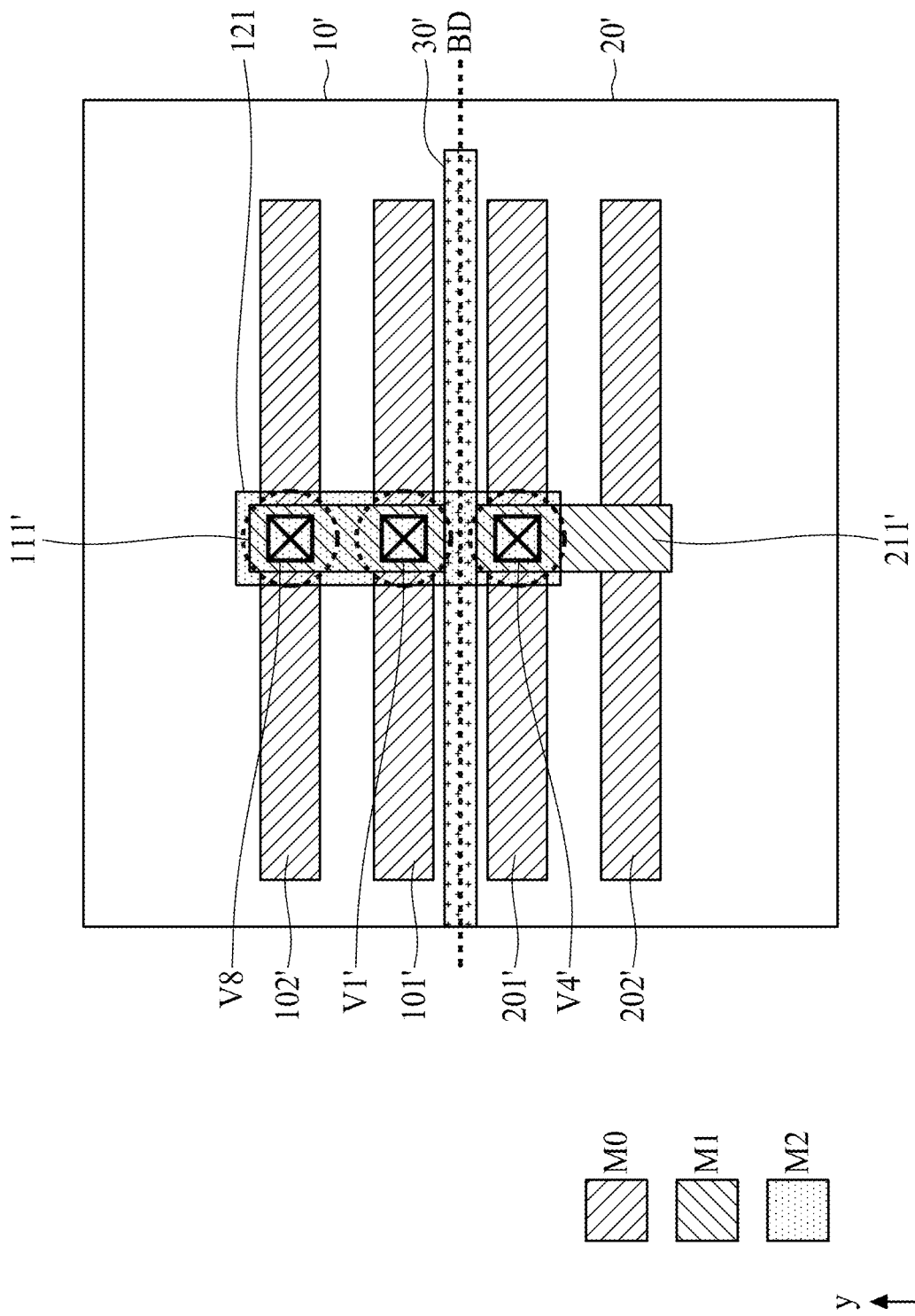

It should be noted that, in the embodiments of FIG. 4A to 4J, the third metal strip 121 in M2 layer extends in the same direction (i.e., y direction) as the second metal strip 111' in M1 layer. With such configurations, the third metal strip 121 in M2 layer can be used for signal connection when a signal routing over two cells is required. FIG. 4K is a top view diagram in accordance with the embodiment of FIG. 4J. It can be seen from FIG. 4K that the third metal strip 121 in M2 layer extends across the boundary BD between the first cell 10' and the second cell 20'. Therefore, the third metal strip 121 in M2 layer can be used for signal connection when a signal routing over the first cell 10' and the second cell 20' is required.

However, this should not be a limitation of the present disclosure. In other embodiments, the third metal strip 121 in M2 layer can extend in different direction (e.g., x direction) for signal connection.

In the present embodiment, the contact via V8 and the third metal strip 121 are formed in two separated operations. However, this is not a limitation of the present disclosure. In other embodiments, a trench puncturing the dielectric layers 502 and 504 can be formed in one lithography process. Subsequently, the conductive material is filled within the trench to form the contact via V8 and the third metal strip 121.

Refer to FIGS. 5A to 5J, which illustrate the second part of the process of manufacturing the semiconductor device in accordance with another embodiment of the present disclosure.

Figure 5A:
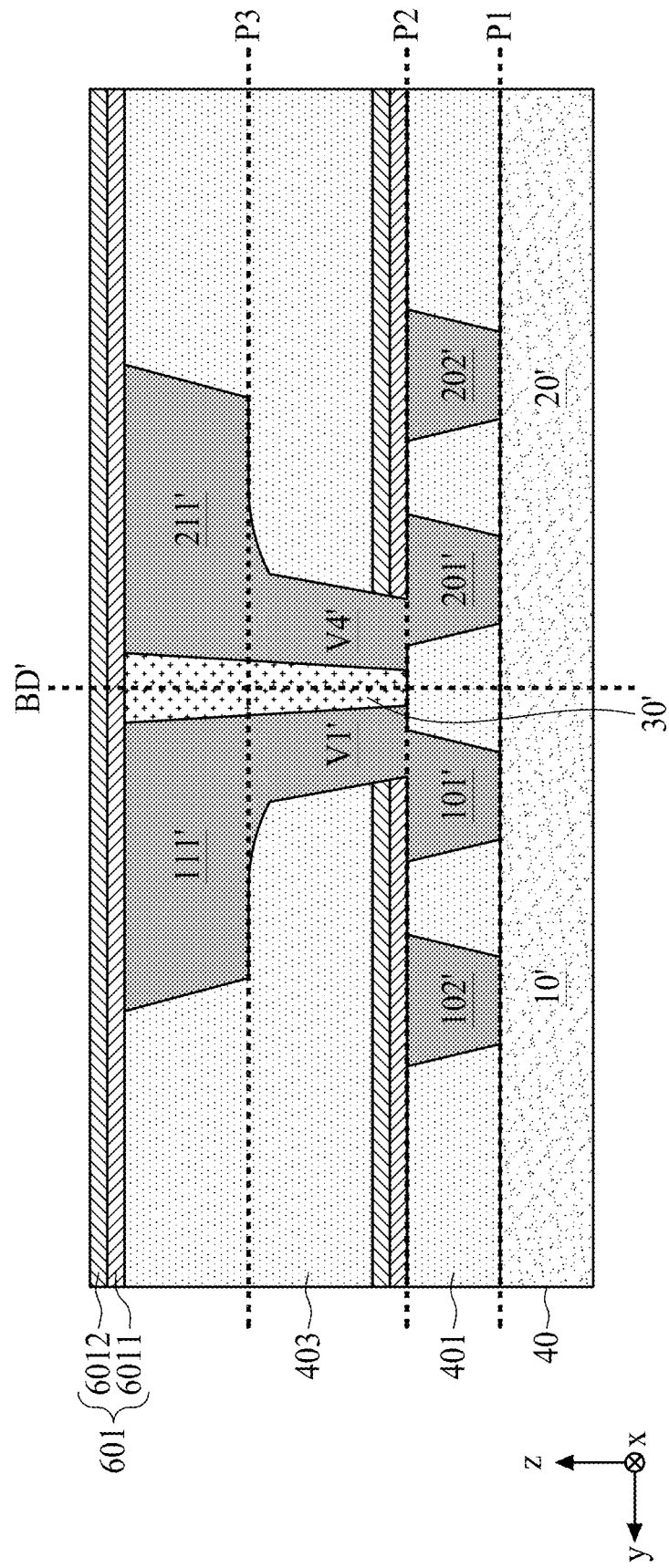
FIG. 5A to FIG. 5J are diagrams illustrating a second part of the process of manufacturing a semiconductor device in accordance with another embodiment of the present disclosure.

In FIG. 5A, an ESL 601 is formed on the dielectric layer 403 in, for example, a coating process. In the present embodiment, the ESL 601 includes a first ESL 6011 formed on the dielectric layer 403 and a second ESL 6012 formed in the first ESL 6011. Suitable materials for the first ESL 6011 includes, but not limited to, silicon nitride, silicon carbide, silicon carbonitride, etc. Suitable materials for the second ESL 6012 includes, but not limited to, silicon nitride, silicon carbide, silicon carbonitride, etc.

Figure 5B:
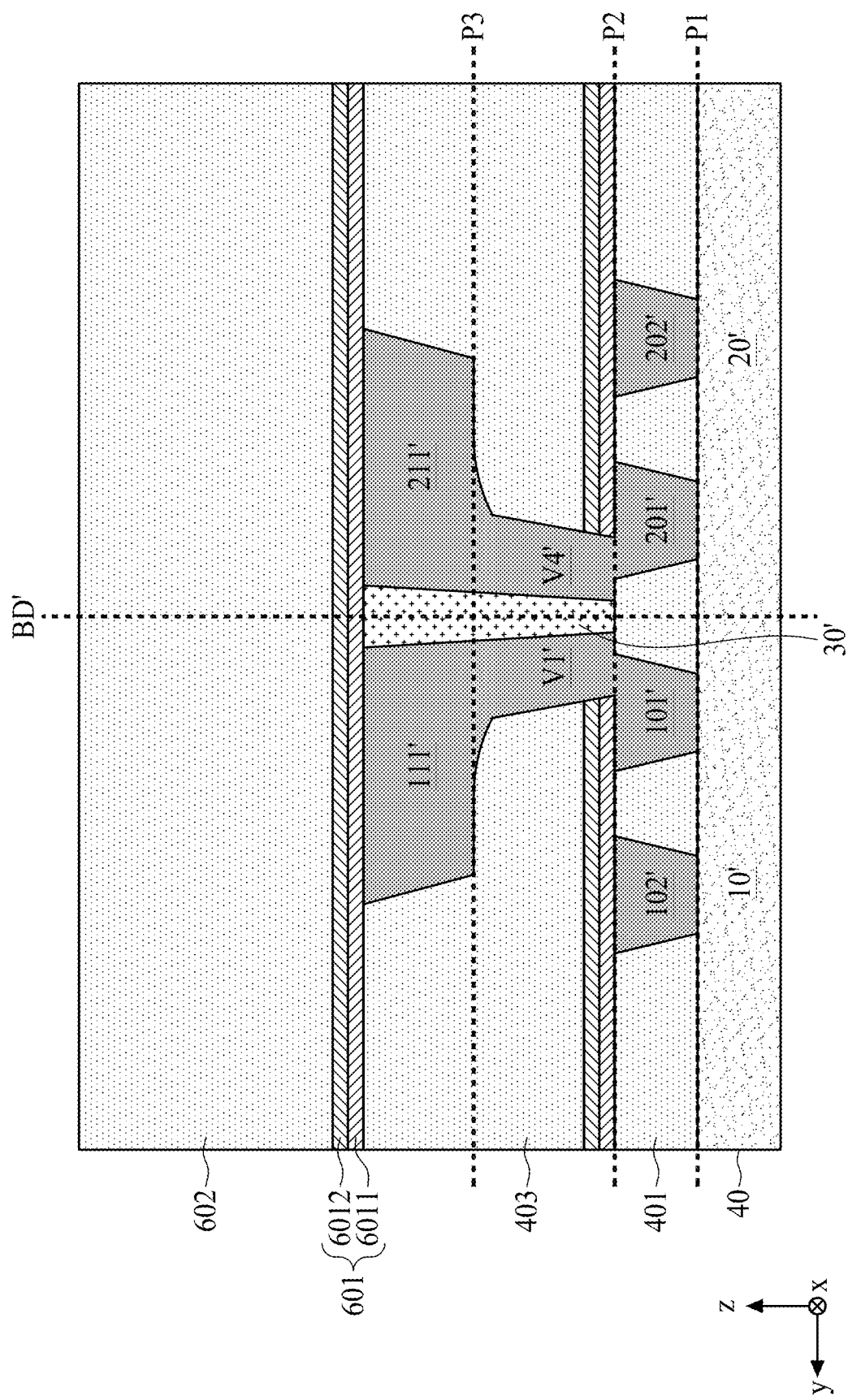
Figure 5C:
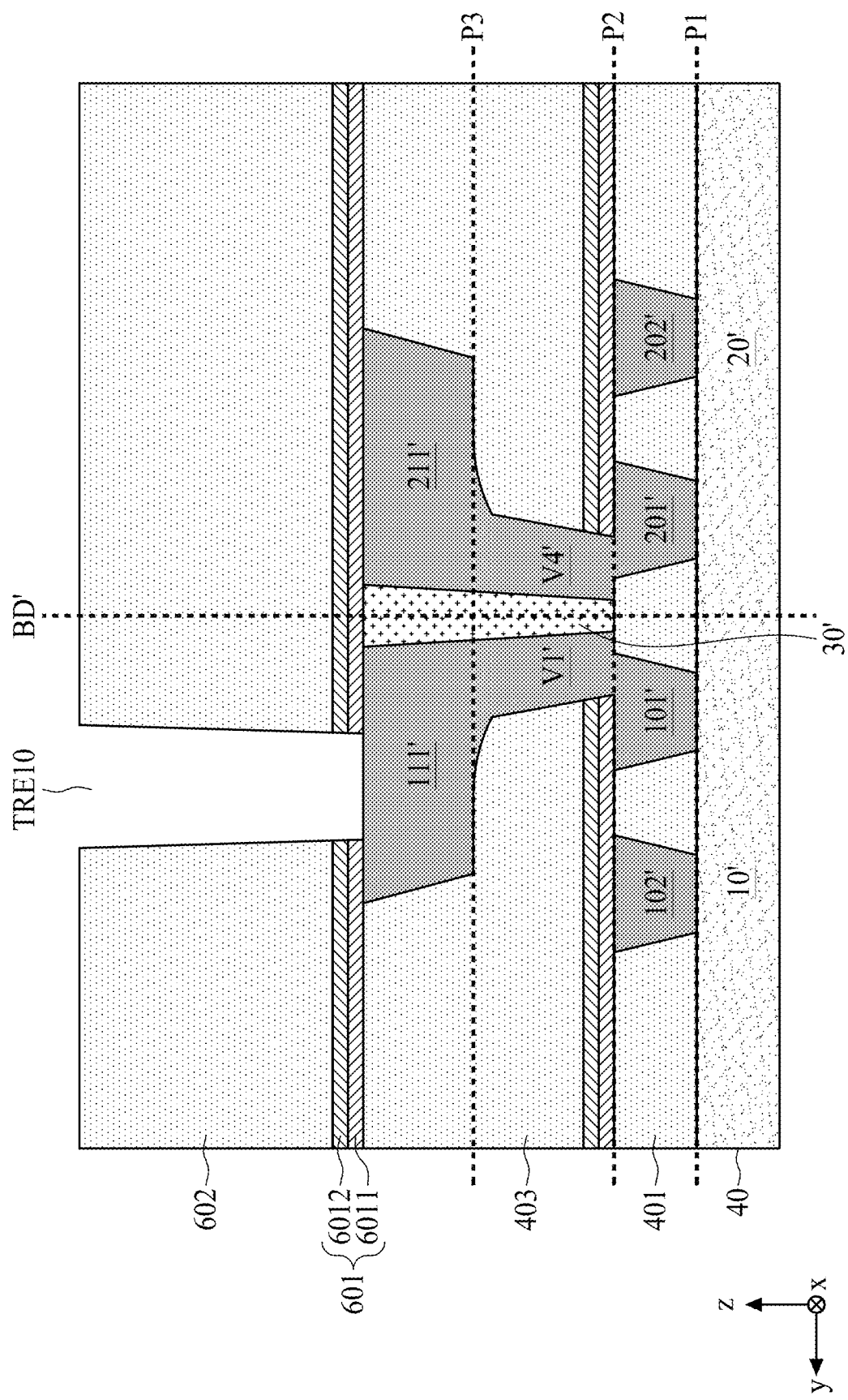
Figure 5D:
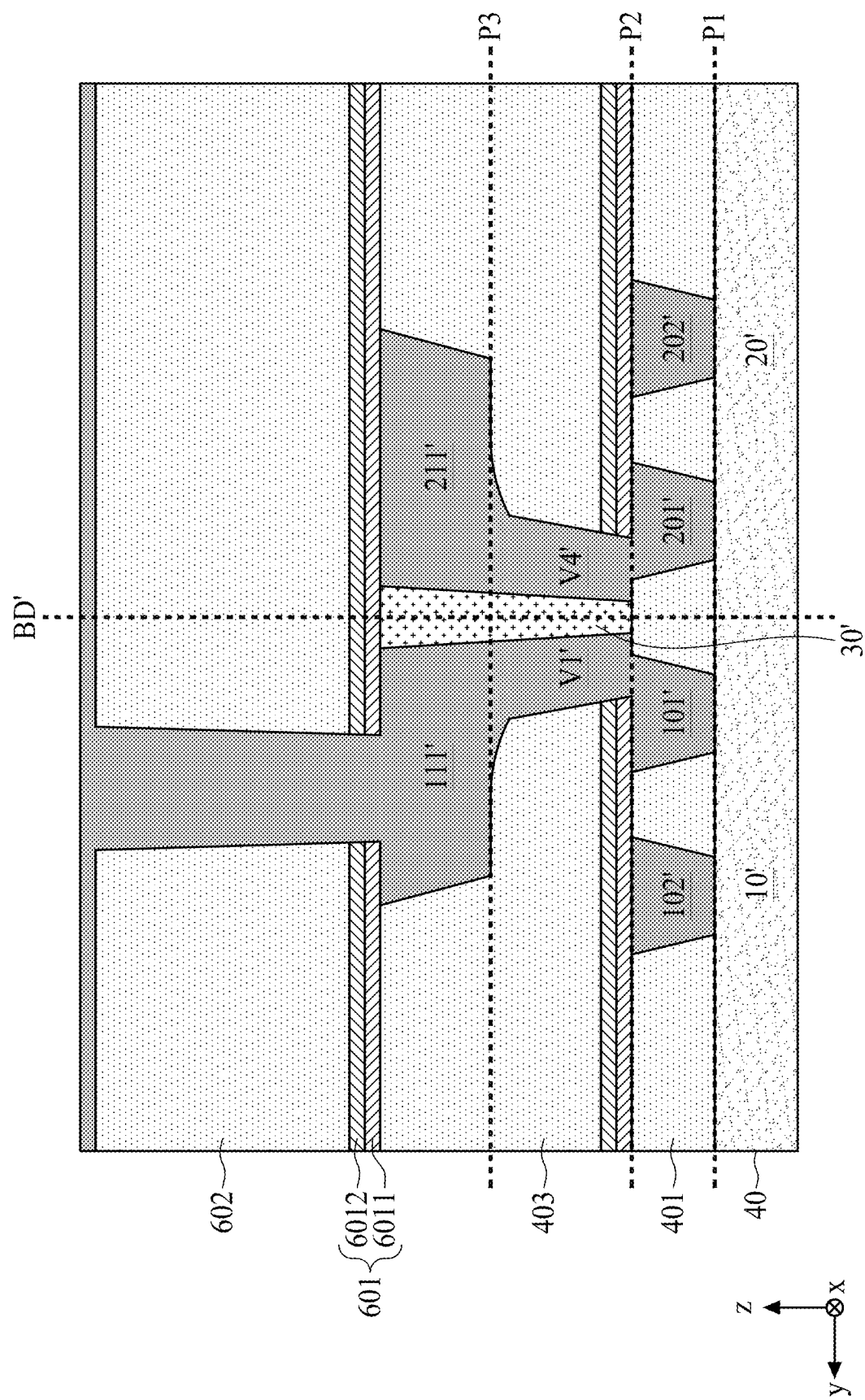
Figure 5E:
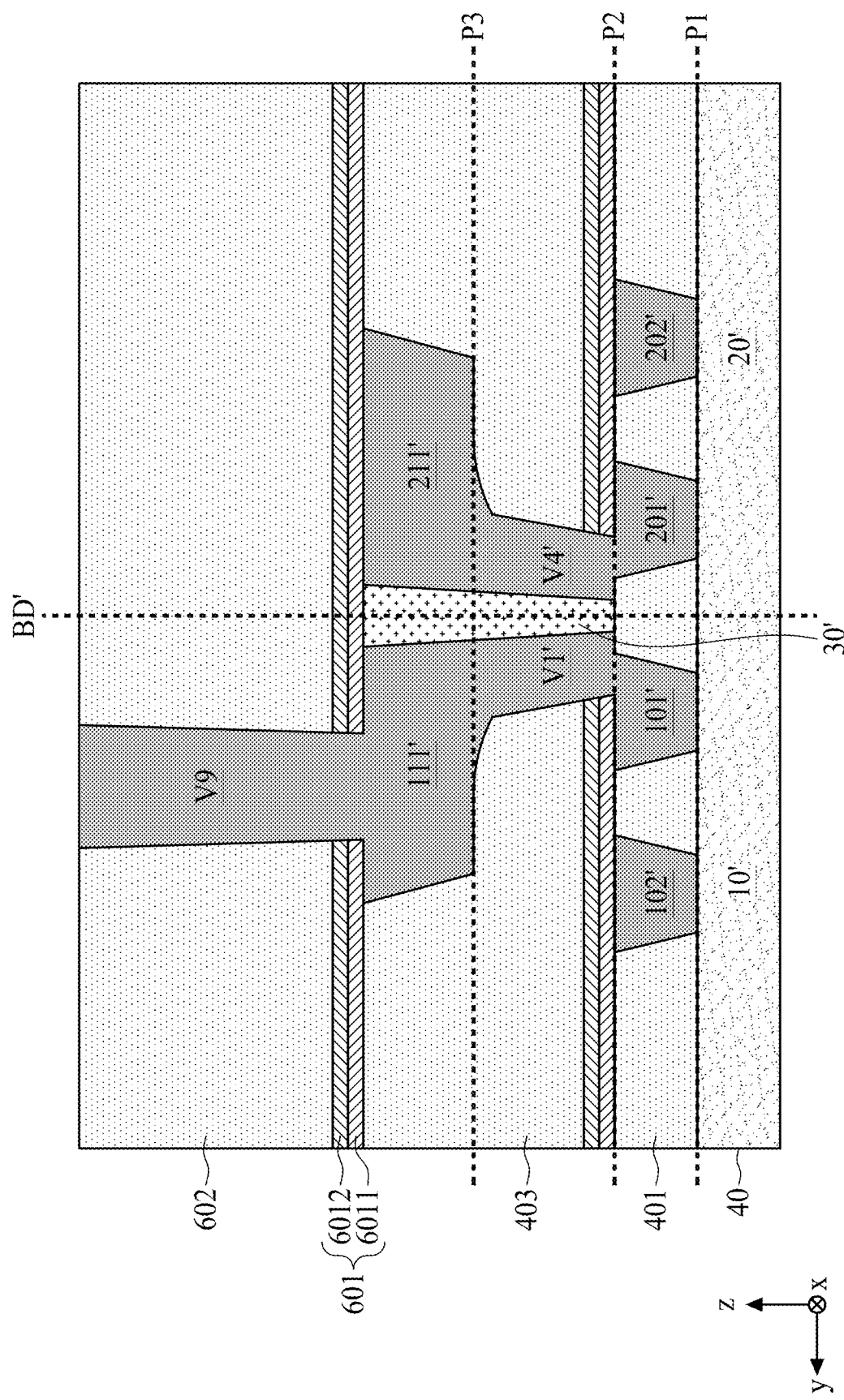

In FIG. 5B, a dielectric layer 602 is formed on the ESL 601 in, for example, a coating process. In FIG. 5C, a plurality of trenches are formed in the dielectric layer 602 in, for example, a lithography process, using a patterned mask layer as a mask. For example, the trench TRE10 is formed in FIG. 5C. In FIG. 5D, a conductive layer is formed on the dielectric layer 502 in, for example, a deposition process, filling the trenches generated in FIG. 5C. In FIG. 5E, the portion of the conductive layer on the dielectric layer 602 is removed by a polishing process such as a chemical-mechanical polishing (CMP) process to form a contact via V9 on the second metal strip 111'.

Figure 5F:
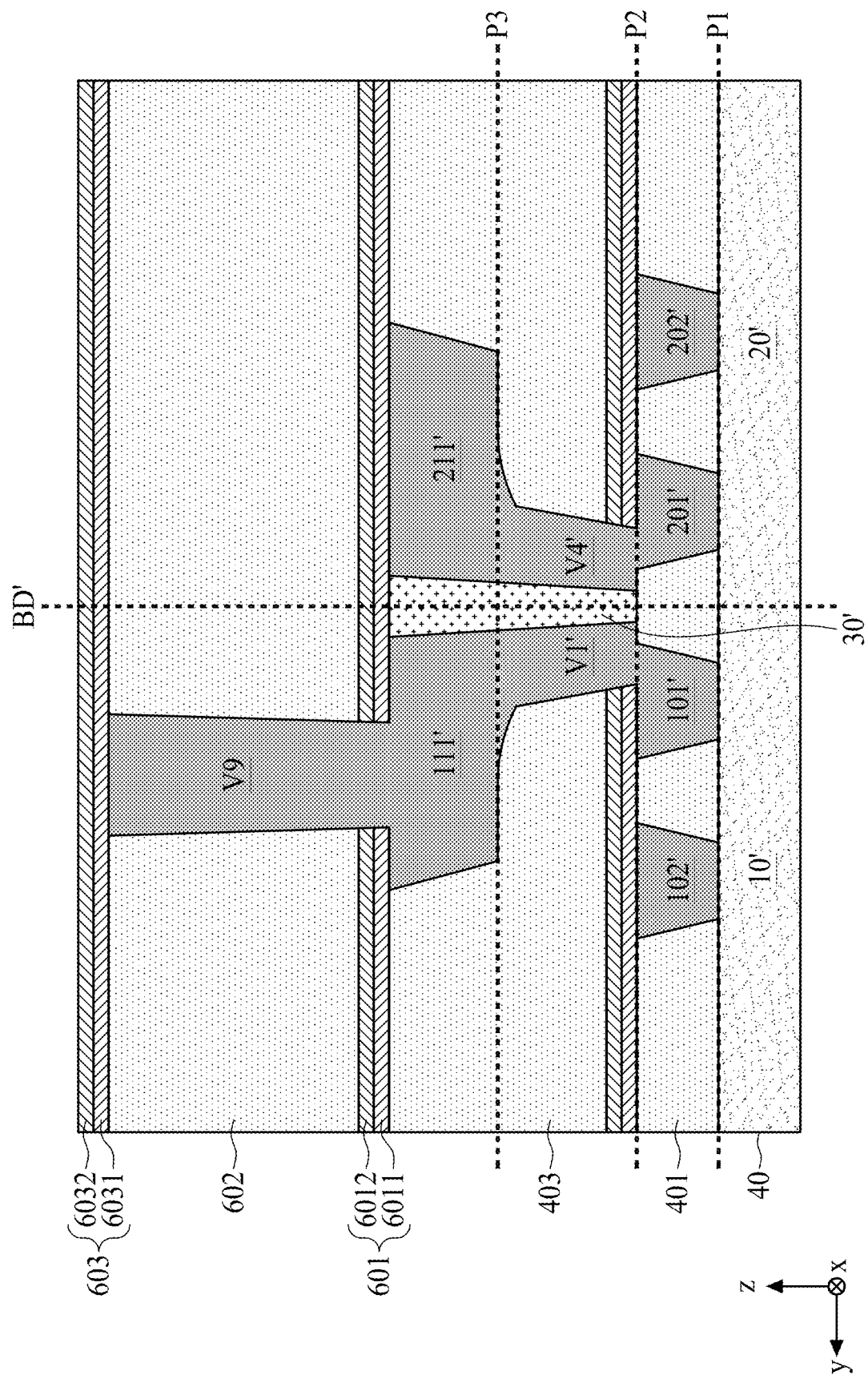
Figure 5G:
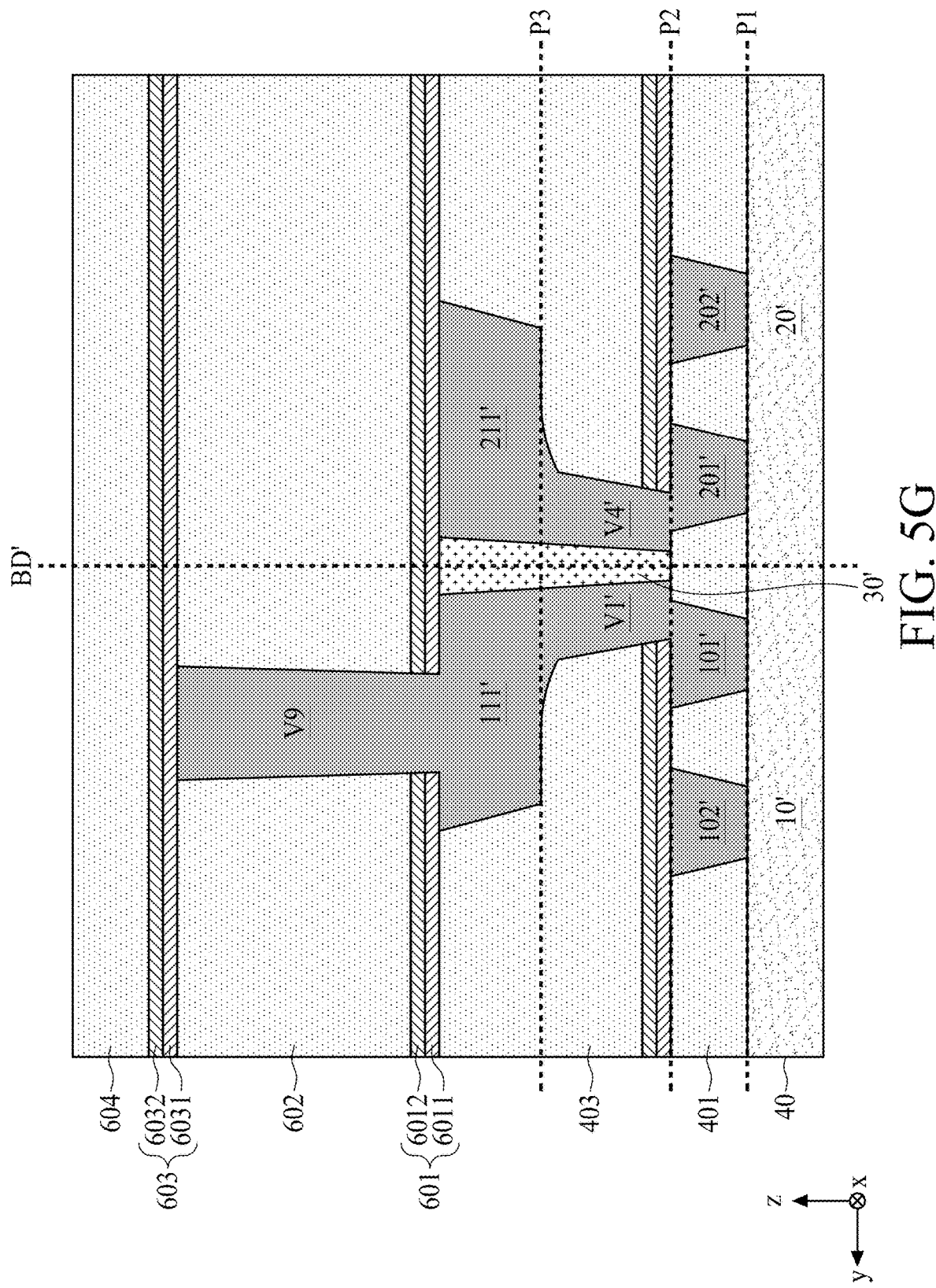

In FIG. 5F, an ESL 603 is formed on the dielectric layer 602 in, for example, a coating process. The ESL 603 further includes a first ESL 6031 formed on the dielectric layer 602 and a second ESL 6032 formed on the first ESL 6031. In FIG. 5G, a dielectric layer 604 is formed on the ESL 603 in, for example, a coating process.

Figure 5H:
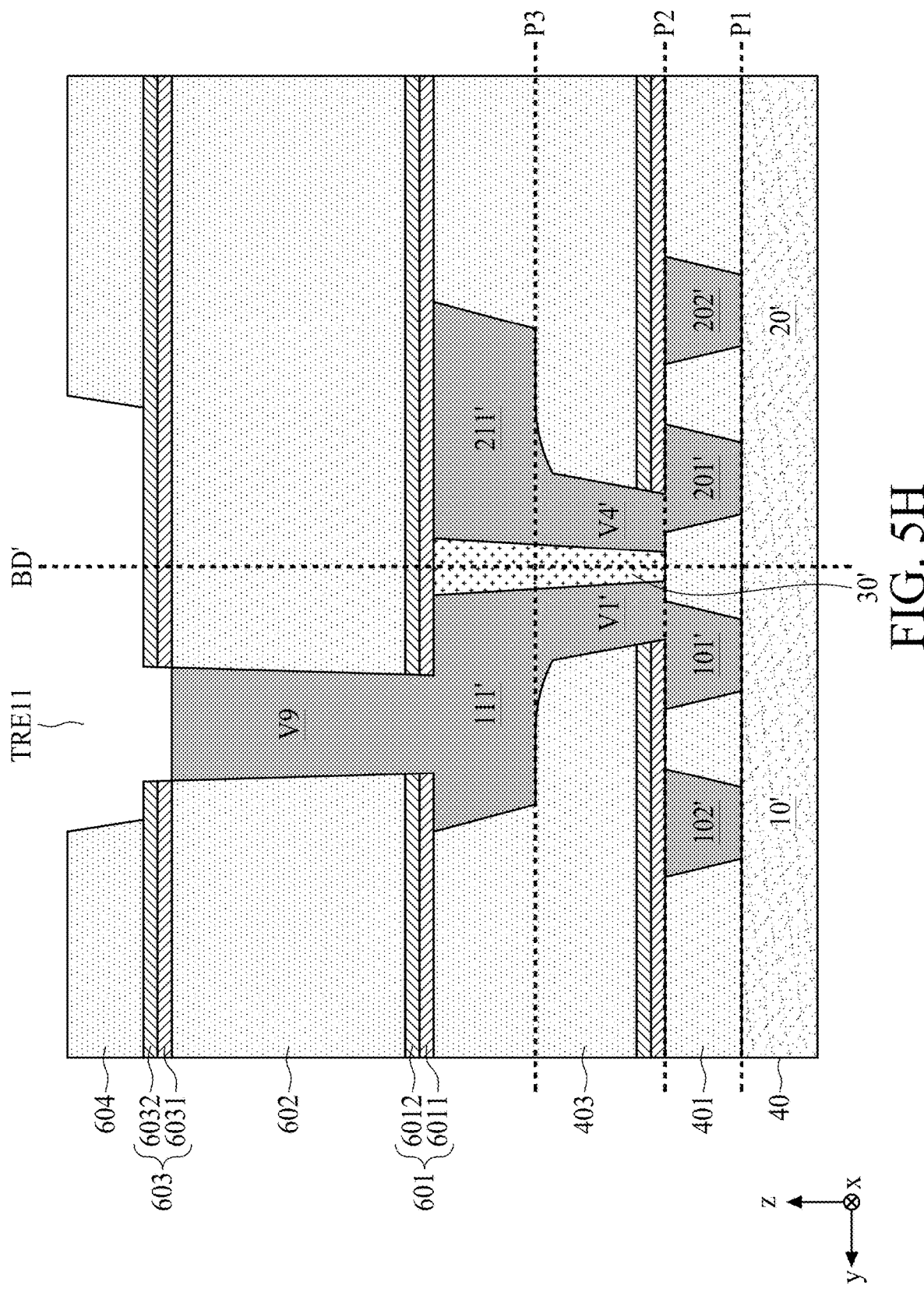
Figure 5I:
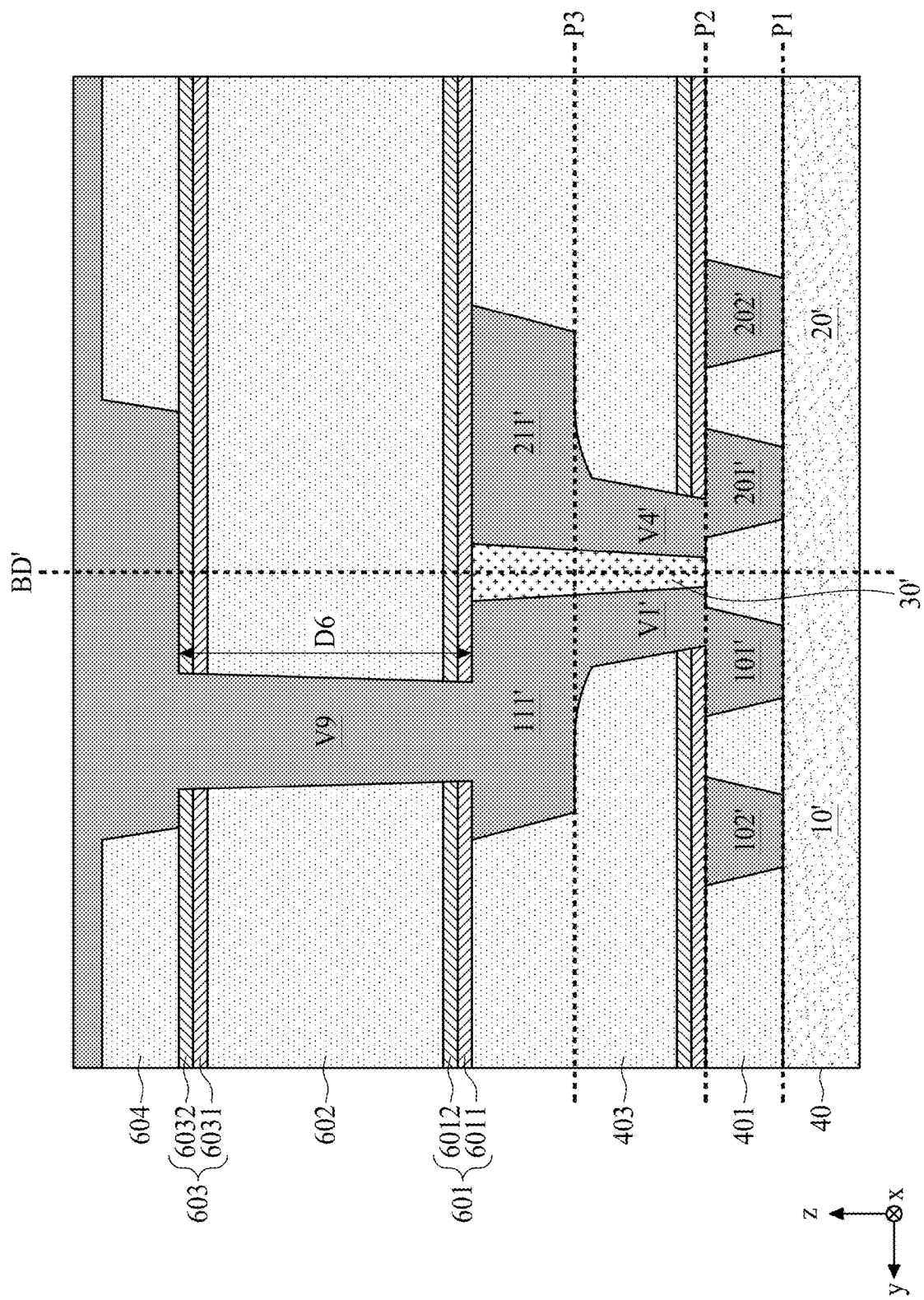
Figure 5J:
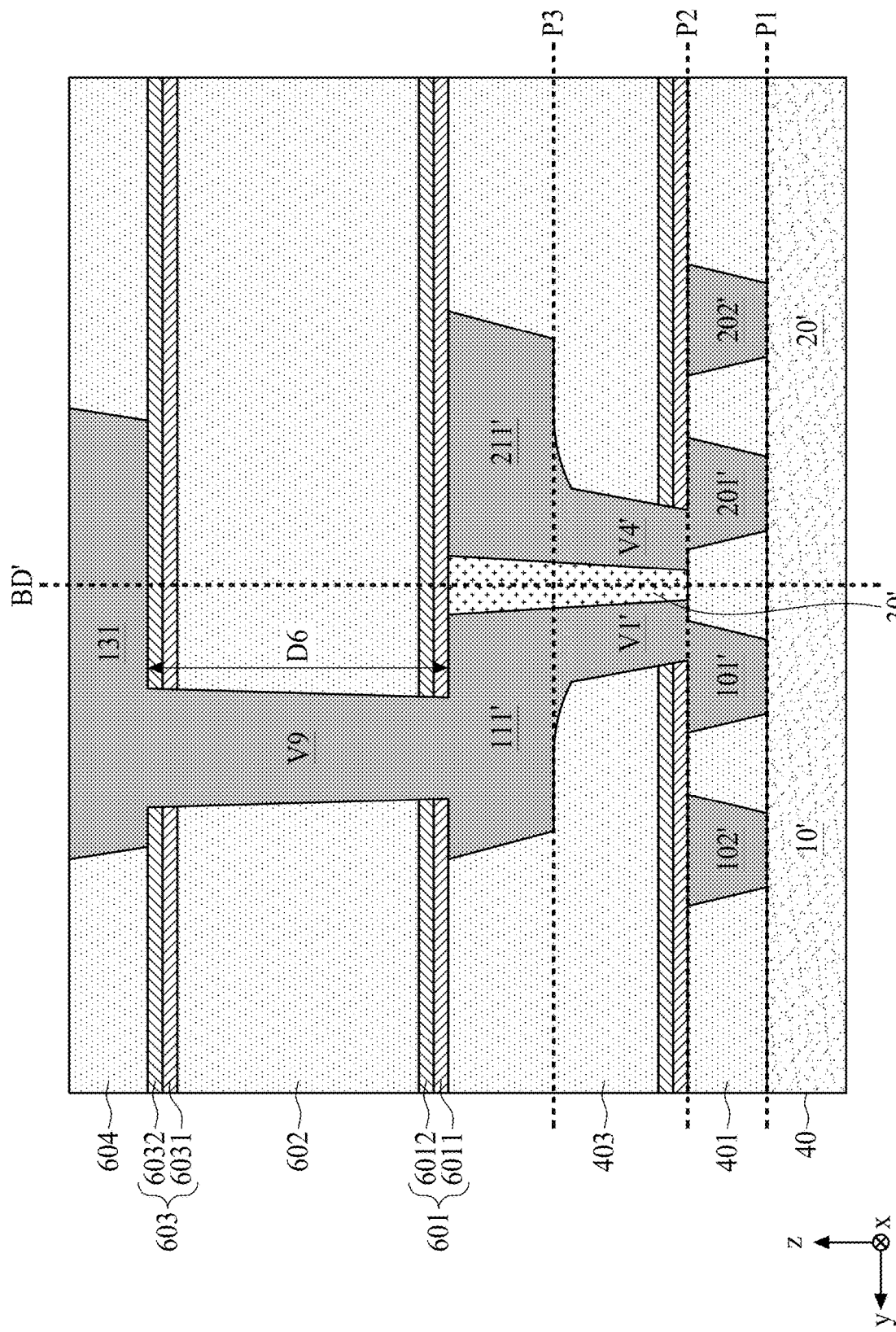

In FIG. 5H, a plurality of trenches are formed in the dielectric layer 604 in, for example, a lithography process, using a patterned mask layer as a mask. For example, the trench TRE11 is formed in FIG. 5H. In FIG. 5I, a conductive layer is formed on the dielectric layer 604 in, for example, a deposition process, filling the trenches generated in FIG. 5H. In FIG. 5J, the portion of the conductive layer on the dielectric layer 604 is removed by a polishing process such as a chemical-mechanical polishing (CMP) process to form a plurality of third metal strips in a fourth metal layer (i.e., M3 layer). For example, a third metal strip 131 extending in y direction is formed on the contact via V9. The length D6 of the contact via V9 connected between the second metal strip 111' in M1 layer and the third metal 131 in M3 layer ranges from approximately 100 nm to approximately 200 nm.

In the present embodiment, the contact via V9 is formed first then the third metal strip 131. However, this is not a limitation of the present disclosure. In other embodiments, a trench puncturing the dielectric layers 602 and 604 can be formed in one lithography process. Subsequently, the conductive material is filled within the trench to form the contact via V9 and the third metal strip 131.

The present disclosure utilizes a separating wall standing above the boundary between two cells to prevent the metal strips above one cell from contacting the metal strips disposed above another one. In the abovementioned mentioned embodiments, the separating wall is arranged to prevent the metal strips in M1 layer from contacting. Therefore, the separating wall extends from M0 layer to M1 layer. However, those skilled in the art should readily understand that, in order to prevent the metal strips in, for example, M2 or M3 layer from contacting, the location of the separating wall can be varied. For example, the separating wall can extend from M2 layer to M3 layer to prevent the metal strips in M3 layer form contacting.

Figure 6:
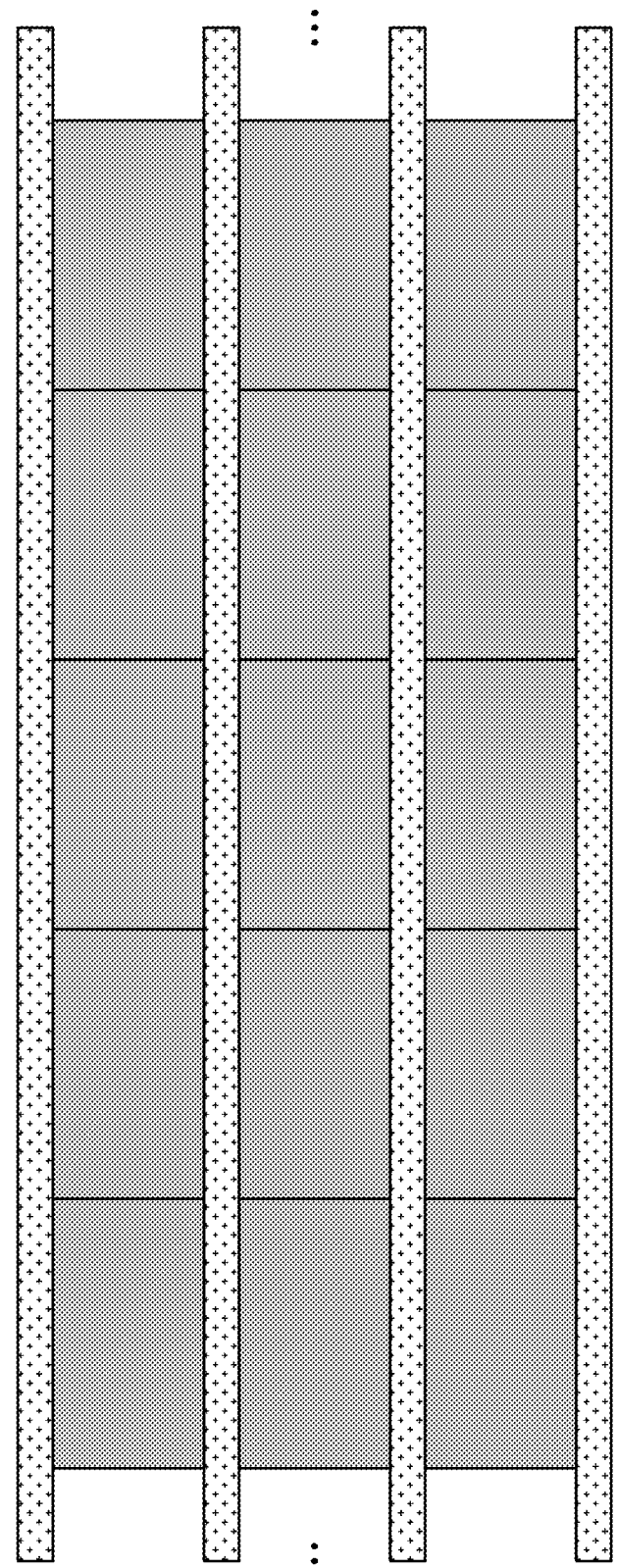
FIG. 6 is a diagram illustrating a semiconductor device in accordance with an embodiment of the present disclosure.

Those skilled in the art should understand that, in actual design, the semiconductor device may include hundreds of thousands of cells. Therefore, the cells are arranged in a huge matrix. With such configurations, to prevent the metal strips from contacting, the separating wall can extend in one direction continuously. FIG. 6 is a diagram illustrating a semiconductor device 2 in accordance with an embodiment of the present disclosure. In FIG. 6, each rectangular represents a cell. The semiconductor device 2 includes a plurality of cells and a plurality of separating walls, wherein each separating wall extends in x direction continuously on the boundary between two cells that are immediate adjacent to each other in y direction.

Figure 7:
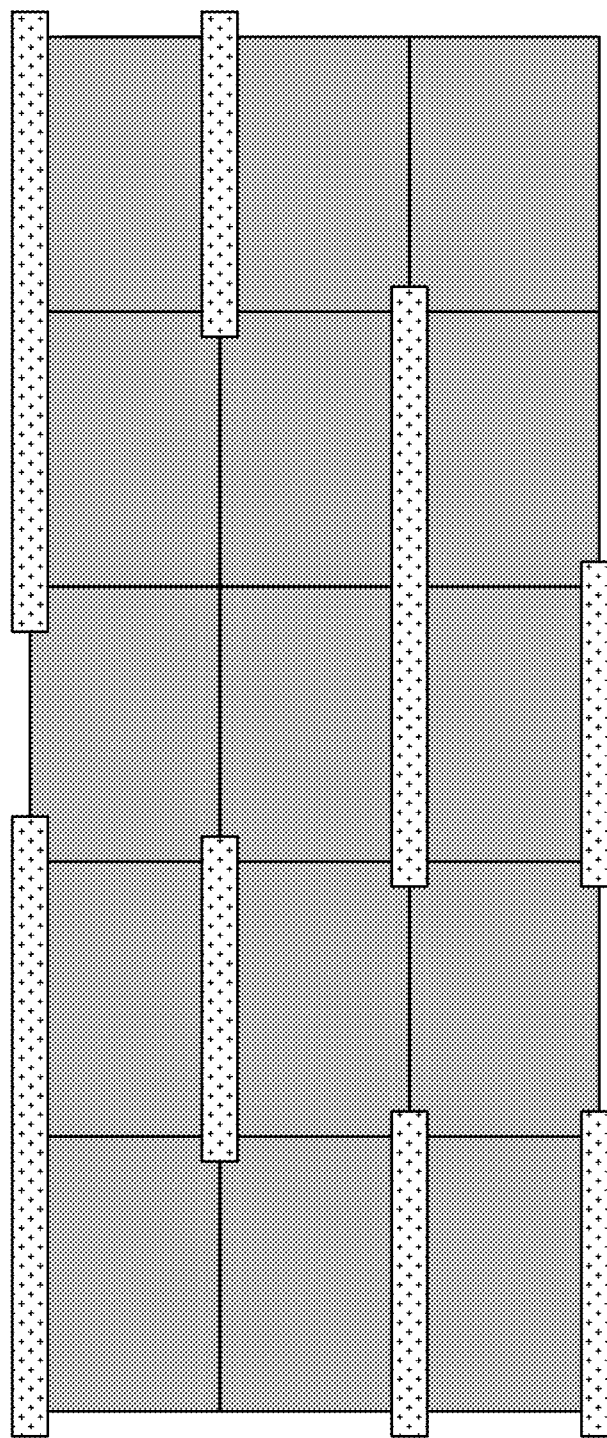
FIG. 7 is a diagram illustrating a semiconductor device in accordance with another embodiment of the present disclosure.

However, this is not a limitation of the present disclosure. In other embodiments, the separating wall extends discretely in x direction. FIG. 7 is a diagram illustrating a semiconductor device 3 in accordance with an embodiment of the present disclosure. In FIG. 7, each rectangular represents a cell. The semiconductor device 3 includes a plurality of cells and a plurality of separating wall segments. Each separating wall segment is arranged to stand on the boundary between two cells that are immediate adjacent to each other in y direction to prevent the metal strips from contacting.

Figure 8:
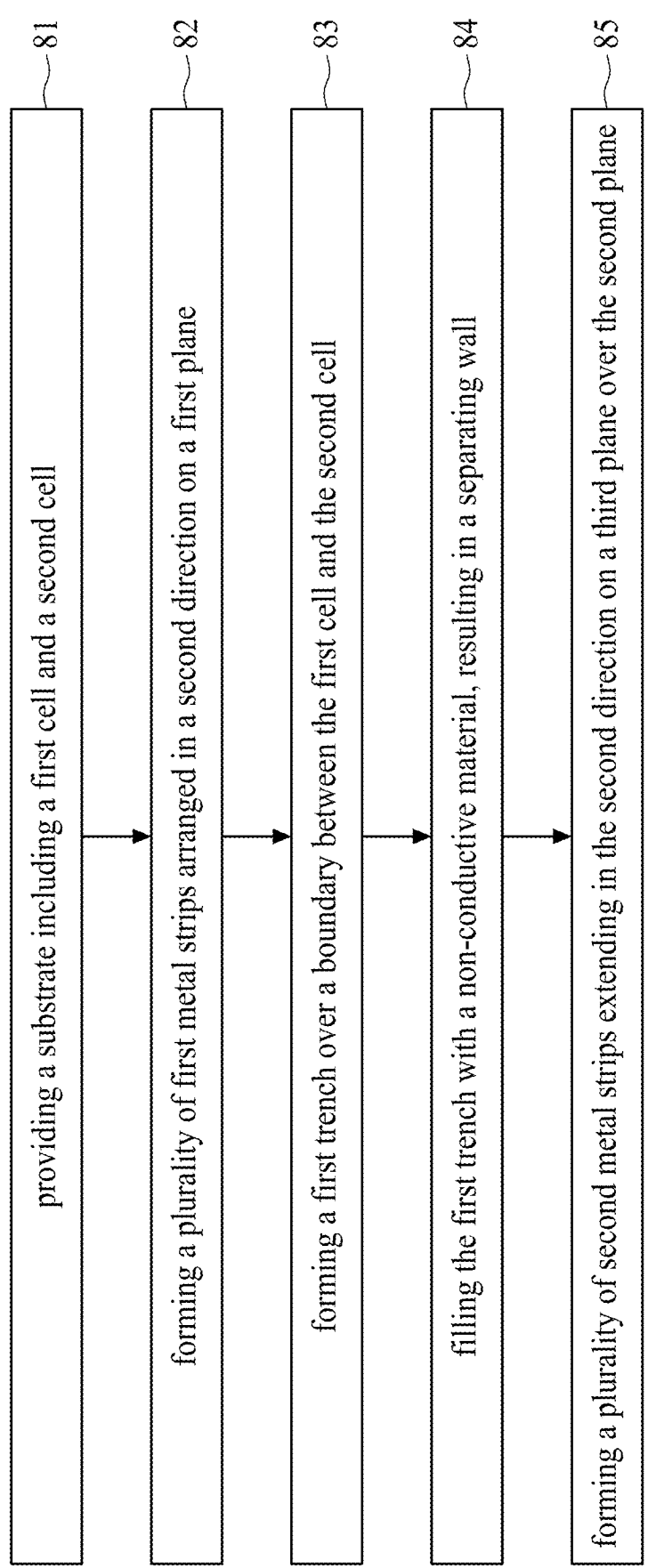
FIG. 8 is a flowchart illustrating a method of manufacturing a semiconductor device in accordance with another embodiment of the present disclosure.

FIG. 8 is a flowchart illustrating a method 8 of manufacturing a semiconductor device in accordance with an embodiment of the present disclosure. Provided that the results are substantially the same, the operations shown in FIG. 8 are not required to be executed in the exact order. The method 8 is summarized as follows:

In Operation 81, a substrate including a first cell and a second cell is provided, wherein the first cell and the second cell are arranged in a first direction.

In Operation 82, a plurality of first metal strip arranged in a second direction is formed on a first plane, wherein the plurality of first metal strips extends in the first direction.

In Operation 83, a first trench is formed over a boundary between the first cell and the second cell, wherein a bottom surface of the first trench is located on a second plane over the first plane.

In Operation 84, the first trench is filled with a non-conductive material, resulting a separating wall, wherein the separating wall extends in the first direction.

In Operation 85, a plurality of second metal strips extending in the second direction are formed on a third plane over the second plane, wherein the plurality of second metal strips comprise a first second metal strip and a second second metal strip separated from each other by the separating wall. The second direction is orthogonal with the first direction.

Figure 9:
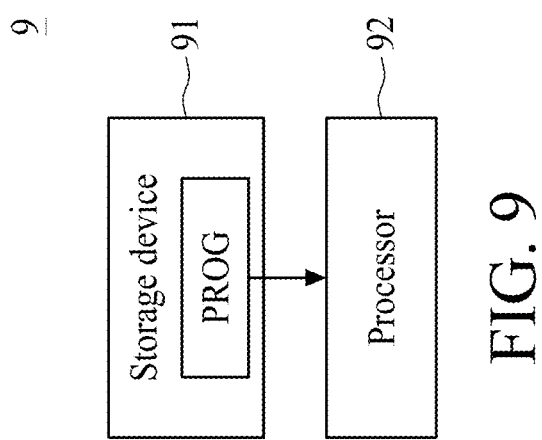
FIG. 9 is a diagram illustrating a system in accordance with another embodiment of the present disclosure.

FIG. 9 is a diagram illustrating a system 9 in accordance with an embodiment of the present disclosure. The system 9 includes storage device 91 and a processor 92. The storage device 91 is arranged to store a program code PROG. When loaded and executed by the processor 92, the program code PROG instructs the processor 92 to execute the following operations: providing a substrate including a first cell and a second cell, wherein the first cell and the second cell are arranged in a first direction; forming a plurality of first metal strips arranged in a second direction on a first plane, wherein the plurality of first metal strips extends in the first direction; forming a first trench over a boundary between the first cell and the second cell, wherein a bottom surface of the first trench is located on a second plane over the first plane; filling the first trench with a non-conductive material, resulting in a separating wall, wherein the separating wall extends in the first direction; and forming a plurality of second metal strips extending in the second direction on a third plane over the second plane, wherein the plurality of second metal strips comprise a first second metal strip and a second second metal strip separated from each other by the separating wall; wherein the second direction is orthogonal to the first direction.

In some embodiments of the present disclosure, a method of manufacturing a semiconductor device is disclosed. The method includes: providing a substrate including a first cell and a second cell, wherein the first cell and the second cell are arranged in a first direction; forming a plurality of first metal strips arranged in a second direction on a first plane, wherein the plurality of first metal strips extends in the first direction; forming a first trench over a boundary between the first cell and the second cell, wherein a bottom surface of the first trench is located on a second plane over the first plane; filling the first trench with a non-conductive material, resulting in a separating wall, wherein the separating wall extends in the first direction; and forming a plurality of second metal strips extending in the second direction on a third plane over the second plane, wherein the plurality of second metal strips comprise a first second metal strip and a second second metal strip separated from each other by the separating wall; wherein the second direction is orthogonal to the first direction.

In some embodiments of the present disclosure, a semiconductor device is disclosure. The semiconductor device includes: a substrate including a first cell and a second cell, a plurality of first metal strips, a separating wall, and a plurality of second metal strips. The plurality of first metal strips extend in a first direction on a first plane, and are arranged in a second direction. A first portion of the plurality of first metal strips are disposed above the first cell while a second portion of the first metal strips are disposed above the second cell. The separating wall extends in the first direction on a second plane over the first plane, and is formed on a boundary between the first cell and the second cell. The plurality of second metal strips extends in the second direction on a third plane over the second plane. A first second metal strip and a second second metal strip are separated from each other by the separating wall. The second direction is orthogonal with the first direction.

In some embodiments of the present disclosure, a system is disclosure. The system includes: a storage device and a processor. The storage device is arranged to store a program code. When loaded and executed by the processor, the program code instructs the processor to execute the following operations: providing a substrate including a first cell and a second cell, wherein the first cell and the second cell are arranged in a first direction; forming a plurality of first metal strips arranged in a second direction on a first plane, wherein the plurality of first metal strips extends in the first direction; forming a first trench over a boundary between the first cell and the second cell, wherein a bottom surface of the first trench is located on a second plane over the first plane; filling the first trench with a non-conductive material, resulting in a separating wall, wherein the separating wall extends in the first direction; and forming a plurality of second metal strips extending in the second direction on a third plane over the second plane, wherein the plurality of second metal strips comprise a first second metal strip and a second second metal strip separated from each other by the separating wall; wherein the second direction is orthogonal to the first direction.

What is claimed is:

1. A semiconductor device, comprising:
   a substrate including a first cell and a second cell;
   a plurality of first metal strips extending in a first direction on a first plane, wherein the plurality of first metal strips are arranged in a second direction, and a first portion of the plurality of first metal strips are disposed above the first cell while a second portion of the first metal strips are disposed above the second cell;
   a separating wall, extending in the first direction on a second plane over the first plane, wherein the separating wall is formed on a boundary between the first cell and the second cell; and a plurality of second metal strips, extending in the second direction on a third plane over the second plane, wherein a first second metal strip and a second second metal strip are separated from each other by the separating wall;

wherein the second direction is orthogonal with the first direction.

2. The semiconductor device of claim 1, further comprising:

a first contact via, disposed on a first first metal strip of the plurality of first metal strips, wherein the first first metal strip is formed immediate adjacent to the boundary;

wherein a distance between the first contact via and the separating wall is smaller than 5 nm.

3. The semiconductor device of claim 1, wherein the separating wall includes at least one of aluminum oxide, chromic oxide, erbium oxide, hafnium oxide, silicon oxide, silicon nitride, carbon oxidation silicon, and silicon oxynitride.

4. The semiconductor device of claim 1, wherein a width of the separating wall in the second direction is less than 10 nm.

5. The semiconductor device of claim 1, further comprising:

a second contact via, disposed on the first second metal strip; and a third metal strip, extending in the second direction, wherein the third metal strip is disposed on the second contact via.

6. The semiconductor device of claim 5, wherein a height of the second contact via is located in a range from 10 nm to 100 nm.

7. The semiconductor device of claim 5, wherein a height of the second contact via is located in a range from 100 nm to 200 nm.

8. A system, comprising:

a storage device, arranged to store a program code, a processor, wherein when loaded and executed, the program instructs the processor to execute following operations:

providing a substrate including a first cell and a second cell, wherein the first cell and the second cell are arranged in a first direction;

forming a plurality of first metal strips arranged in a second direction on a first plane, wherein the plurality of first metal strips extends in the first direction;

forming a first trench over a boundary between the first cell and the second cell, wherein a bottom surface of the first trench is located on a second plane over the first plane;

filling the first trench with a non-conductive material, resulting in a separating wall, wherein the separating wall extends in the first direction; and forming a plurality of second metal strips extending in the second direction on a third plane over the second plane, wherein the plurality of second metal strips comprises a first second metal strip and a second second metal strip separated from each other by the separating wall;

wherein the second direction is orthogonal to the first direction.

9. The system of claim 8, wherein the plurality of first metal strip includes a first first metal strip immediate adjacent to the boundary, and forming the plurality of second metal strips extending in the second direction on the third plane comprises:

forming a second trench around the separating wall on the first first metal strip.

10. The system of claim 9, wherein forming the plurality of second metal strips further comprises:

filling the second trench with a conductive material, resulting in a contact via and the first second metal strip;

wherein the contact via is connected between the first first metal strip and the first second metal strip.

11. The system of claim 9, wherein a distance between the contact via and the wall is less than 5 nm, and the separating wall includes at least one of aluminum oxide, chromic oxide, erbium oxide, hafnium oxide, silicon oxide, silicon nitride, carbon oxidation silicon, and silicon oxynitride.

12. The system of claim 9, wherein a width of the separating wall in the second direction is smaller than 10 nm.

13. The system of claim 9, wherein the program further instructs the processor to execute following operations:

forming a contact via on the first second metal strip; and forming a third metal strip extending in the second direction on the contact via.

14. The system of claim 13, wherein a height of the contact via is in a range from 10 to 100 nm.

15. The system of claim 13, wherein a height of the contact via is in a range from 100 to 200 nm.

16. A semiconductor device, comprising:

a first cell and a second cell, formed on a substrate and arranged in a first direction;

a separating wall, extending in the first direction on a first plane, wherein the separating wall is formed on a boundary between the first cell and the second cell;

a plurality of first metal strips extending in a second direction on a second plane below the first plane, wherein a first portion of the plurality of first metal strips are disposed above the first cell while a second portion of the first metal strips are disposed above the second cell; and a plurality of second metal strips, extending in the first direction on a third plane over the second plane, wherein a first second metal strip and a second second metal strip are separated from each other by the separating wall;

wherein the second direction is orthogonal with the first direction.

17. The semiconductor device of claim 16, further comprising:

a first contact via, disposed on a first first metal strip of the plurality of first metal strips, wherein the first first metal strip is formed immediate adjacent to the boundary;

wherein a distance between the first contact via and the separating wall is smaller than 5 nm.

18. The semiconductor device of claim 16, wherein the separating wall includes at least one of aluminum oxide, chromic oxide, erbium oxide, hafnium oxide, silicon oxide, silicon nitride, carbon oxidation silicon, and silicon oxynitride.

19. The semiconductor device of claim 16, wherein a width of the separating wall in the second direction is less than 10 nm.

20. The semiconductor device of claim 16, further comprising:

a second contact via, disposed on the first second metal strip; and a third metal strip, extending in the second direction, wherein the third metal strip is disposed on the second contact via.

* * * * *